US 9,450,110 B2

(12) United States Patent
Kawano et al.

(10) Patent No.: US 9,450,110 B2
(45) Date of Patent: Sep. 20, 2016

(54) SEMICONDUCTOR DEVICE

(71) Applicant: FUJI ELECTRIC CO., LTD., Kawasaki (JP)

(72) Inventors: Ryouichi Kawano, Matsumoto (JP); Takashi Shiigi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/821,348

(22) Filed: Aug. 7, 2015

(65) Prior Publication Data
US 2015/0349144 A1 Dec. 3, 2015

Related U.S. Application Data

(63) Continuation of application No. PCT/JP2014/057012, filed on Mar. 14, 2014.

(30) Foreign Application Priority Data

Mar. 21, 2013 (JP) .................................. 2013-058528

(51) Int. Cl.
*H01L 31/113* (2006.01)
*H01L 23/58* (2006.01)
*H01L 29/861* (2006.01)
*H01L 29/36* (2006.01)
*H01L 29/06* (2006.01)

(52) U.S. Cl.
CPC .......... *H01L 29/861* (2013.01); *H01L 29/0615* (2013.01); *H01L 29/0619* (2013.01); *H01L 29/36* (2013.01)

(58) Field of Classification Search
CPC ................. H01L 29/8611; H01L 2924/13055; H01L 29/0615; H01L 29/7811; H01L 29/0692; H01L 27/0255; H01L 29/66136; H01L 29/66106; H01L 29/7393; H01L 29/7455; H01L 29/866
USPC ........ 257/339, 341, 342, 345, 401, 487, 496
See application file for complete search history.

(56) References Cited

U.S. PATENT DOCUMENTS

| 5,859,446 A | 1/1999 | Nagasu et al. |
| 5,969,400 A | 10/1999 | Shinohe et al. |
| 6,177,713 B1 | 1/2001 | Aono et al. |

(Continued)

FOREIGN PATENT DOCUMENTS

| JP | 6-334188 | 12/1994 |
| JP | 8-316480 | 11/1996 |

(Continued)

OTHER PUBLICATIONS

International Search Report mailed May 27, 2014, in corresponding International Patent Application No. PCT/JP2014/057012.

*Primary Examiner* — Hsien Ming Lee

(57) ABSTRACT

The semiconductor device includes a p-anode region disposed on an n-drift region, and a p-diffusion region disposed so as to be in contact with the p-anode region on the n-drift region. A resistance region disposed so as to be in contact with the p-diffusion region on an n⁻ region, a plurality of p-guard ring regions, and a stopper region disposed away from the p-guard ring regions are provided. By providing the p-diffusion region, withdrawal of holes that concentrate to the p-anode region at the time of reverse recovery is suppressed, so that the semiconductor device has a high reverse recovery tolerance.

13 Claims, 17 Drawing Sheets

(56) References Cited

U.S. PATENT DOCUMENTS

| | | | |
|---|---|---|---|
| 9,059,238 B2* | 6/2015 | Kurata | H01L 29/7397 |
| 2003/0067033 A1 | 4/2003 | Kinoshita et al. | |
| 2005/0056912 A1 | 3/2005 | Ninomiya et al. | |
| 2005/0263842 A1 | 12/2005 | Matsui et al. | |
| 2012/0126315 A1* | 5/2012 | Onishi | H01L 29/0634 257/329 |
| 2014/0091359 A1 | 4/2014 | Otsuki et al. | |

FOREIGN PATENT DOCUMENTS

| | | |
|---|---|---|
| JP | 2000-49360 | 2/2000 |
| JP | 2000-114550 | 4/2000 |
| JP | 2000-150859 | 5/2000 |
| JP | 2002-270857 | 9/2002 |
| JP | 2003-101039 | 4/2003 |
| JP | 3444081 | 6/2003 |
| JP | 2005-93550 | 4/2005 |
| JP | 2005-340528 | 12/2005 |
| JP | 2008-263217 | 10/2008 |
| JP | 2009-38213 | 2/2009 |
| JP | 2009-164486 | 7/2009 |
| JP | 2012-151143 | 8/2012 |
| JP | 2012-186318 | 9/2012 |
| JP | 2014-38937 | 2/2014 |
| JP | 2014-75384 | 4/2014 |

* cited by examiner

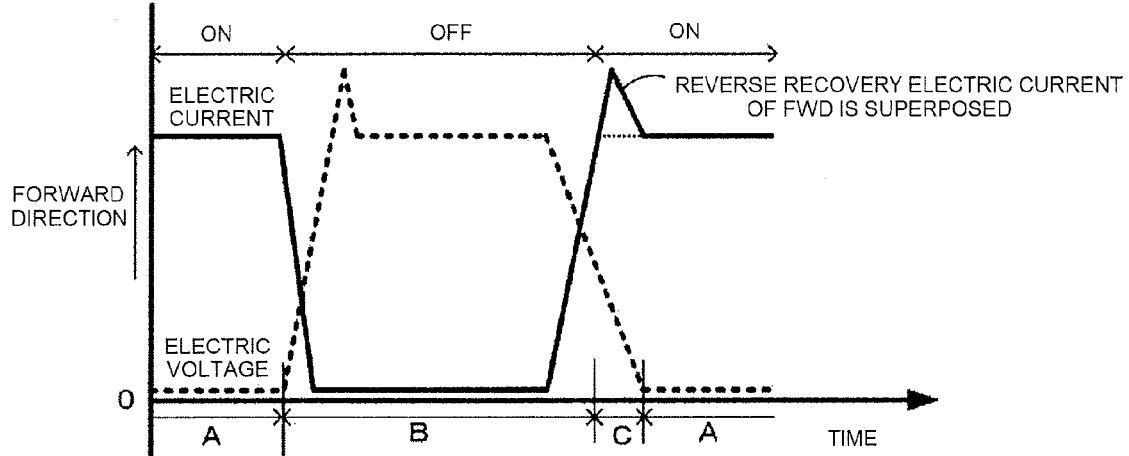
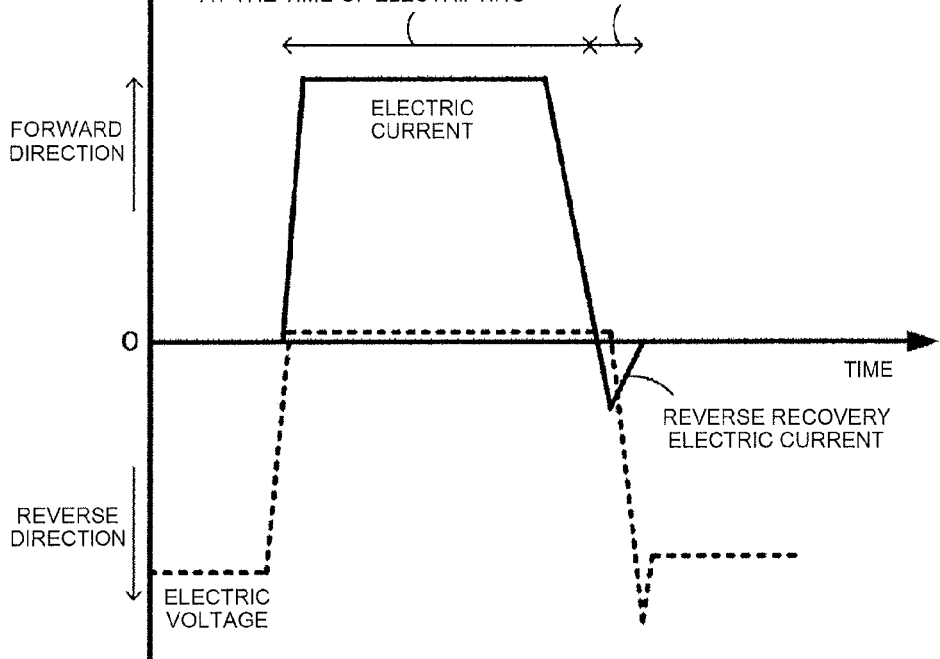
FIG.10

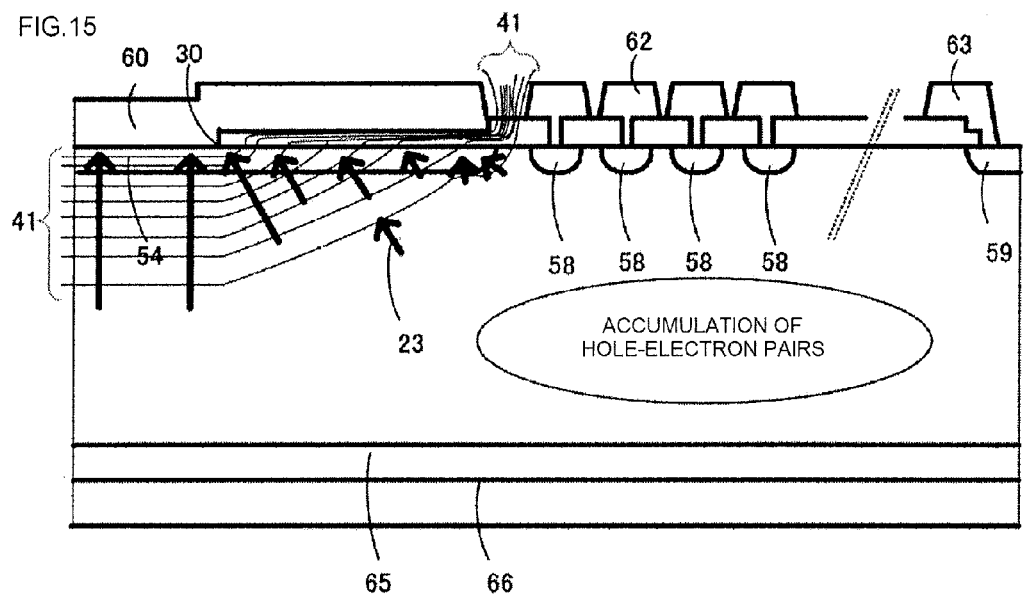
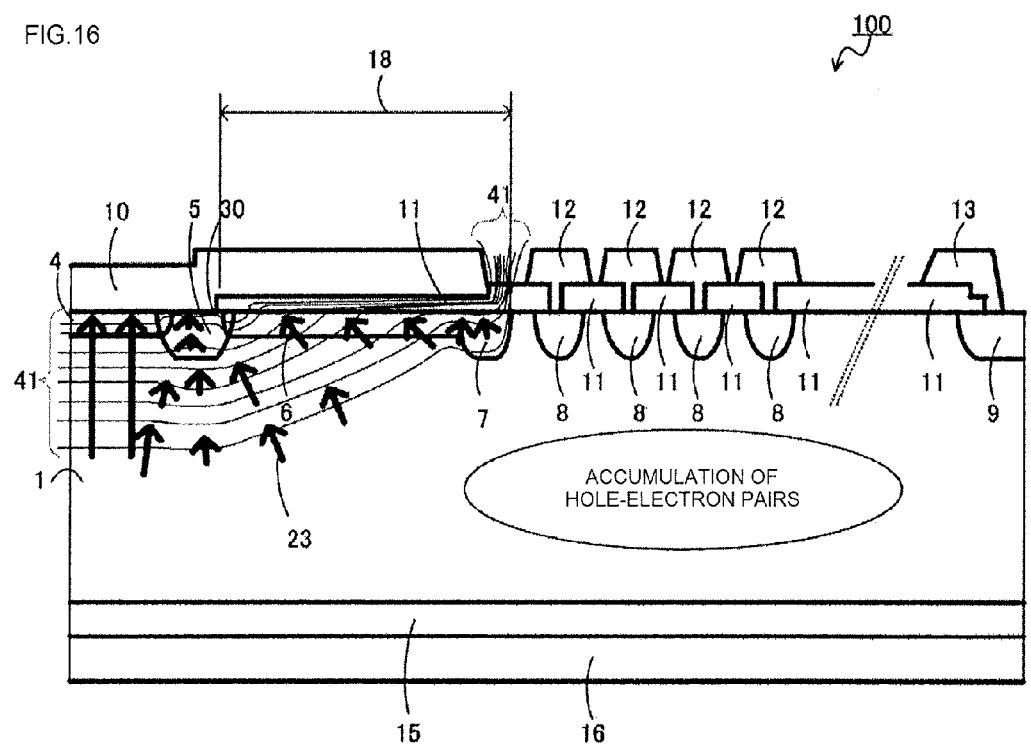

SEMICONDUCTOR DEVICE

CROSS-REFERENCE TO RELATED APPLICATIONS

This application is a continuation application, filed under 35 U.S.C. §111(a), of International Application PCT/JP2014/057012 filed on Mar. 14, 2014, and claims benefit of foreign priority to Japanese Application 2013-058528 filed on Mar. 21, 2013, the disclosure of each of which is incorporated herein by reference.

BACKGROUND

1. Field

The present disclosure relates to a semiconductor device such as a power semiconductor module.

2. Related Art

In recent years, in response to a demand for energy saving, expanding applications of power semiconductor modules have been in progress. An explanation is made about an example of this power semiconductor module. FIG. 8 is a substantial part circuit diagram of a power semiconductor module 500. A circuit of this power semiconductor module 500 is composed of a converter part 81, a brake part 82, and an inverter part 83.

The converter part 81 is constituted of three-phases of a U-phase, a V-phase, and a W-phase. Each phase is configured of upper and lower arms and each arm is provided with a diode 84. A brake part 82 is provided with a diode 85 and an IGBT (insulated gate bipolar transistor) 86. In the brake part 82, the diode 85 and the IGBT 86 are connected in parallel.

The inverter part 83 is constituted of three-phases of a U-phase, a V-phase, and a W-phase, and each phase is configured of upper and lower arms. One arm of the inverter part 83 is provided with an IGBT 87 and a FWD (free-wheeling diode) 88, which is a diode. The IGBT 87 and the FWD 88 are connected in reverse parallel. In the inverter part 83, single ones of or plural ones of the IGBT(s) 87 and the FWD(s) 88 may be connected in parallel. The FWD 88 used in the inverter part 83 has a reverse recovery mode. A high reverse recovery tolerance is required because a breakdown tends to occur in this reverse recovery mode.

FIG. 9 is a substantial part cross-sectional view of an FWD 88 in the past. The cross-sectional view of FIG. 9 is an enlarged view of an edge termination structure and the vicinity thereof, and illustrates a structure similar to one, for example, illustrated in FIG. 1 of Patent Literature 4. In FIG. 9, the FWD 88 is provided with a p-anode region 54 and an anode edge part region 55 that are disposed on an n-drift region 52 formed in an n-semiconductor substrate 51, and p-guard ring regions 58 and a p-stopper region 59 that are disposed on an n$^-$-region 53 that is an extending part of the n-drift region 52. In addition, the FWD88 is provided with an anode electrode 60 disposed on the p-anode region 54 and the anode edge part region 55.

In addition, the FWD 88 is provided with insulating films 61 disposed on the p-guard ring regions 58 and the p-stopper region 59. Moreover, the FWD 88 is provided with guard ring electrodes 62 that are electrically connected to the corresponding p-guard ring regions 58, and a stop electrode 63 that is electrically connected to the p-stopper region 59. A diffusion depth and an impurity density in the anode edge part region 55 are the same as a diffusion depth and an impurity density in the p-guard ring region 58, respectively.

Furthermore, the FWD 88 is provided with an n-cathode region 65 disposed below the n-drift region 52, and a cathode electrode 66 that is electrically connected to the n-cathode region 65. In the FWD 88, a region where the p-anode region 54 is formed is an active part 64; and a region where the p-guard ring regions 58, the p-stopper regions 59, and the insulating films 61 are formed is an edge termination structure 67. Incidentally, a symbol 52 in the drawing represents an n-drift region; and a symbol 53 represents n$^-$-region that is the extending part of the n-drift region 52. These regions 52, 53 may be referred to collectively and simply as drift regions.

Next, a circuit operation of the three-phase inverter circuit (the inverter part 83) when an inductance such as an un-illustrated motor is connected to the inverter circuit (the inverter part 83) as a load. Here, paying attention to the U phase and the V phase, an explanation is made about a case where the IGBT 87 of the lower arm of the W phase and the IGBT 87 of the upper arm of the U phase are both turned on, which causes an electric current to flow through the motor, thereby rotating the motor. Although an electric current flows through the lower arm or the upper arm of the W phase in reality, such electric current is omitted for the sake of convenience, and a case where a single phase inverter of the U phase or the V phase are connected to the motor is explained.

The IGBT 87 of the upper arm of the U phase and the IGBT 87 of the lower arm of the W phase are repeatedly on and off. A longer on-period allows the electric current flowing through the motor to be increased; and a longer off-period allows the electric current flowing through the motor to be decreased. With these increase and decrease of this electric current, a torque and a rotation speed of the motor are controlled. In the following, a time during which the FWD 88 is on is called a time of electrifying; and a time at which the FWD 88 is shifted from the on-state to the off-state is called a time of reverse recovery.

FIG. 10 is an explanatory view illustrating a voltage-current waveform of the FWD 88 and the IGBT 87. Using FIG. 10, the operations are explained for each section thereof. (1) A-section is in the state where the IGBT 87 is on and the electric current is supplied to the motor. In the state where the IGBT 87 is on and the electric current is supplied to the motor, no electric current flows through the FWD 88. (2) B-section is in the state where the IGBT 87 is off. In this case, the electric current that has flown through the motor loses its destination, and thus flows into the inverter part 83 by way of the arm of the FWD 88. This electric current is called a reflux electric current, which is a forward electric current in relation to the FWD 88. When the forward electric current flows in the FWD 88 is the "time of electrifying". (3) C-section is in the state where the IGBT 87 is on again. The electric current due to the IGBT 87 being on is a reverse electric current in relation to the electric current flowing through the motor and the FWD 88 connected to this IGBT 87 in series. The reverse electric current flowing in the FWD 88 comes into halt at the stage where the FWD 88 is reverse recovered, and all the current flows into the motor. This series of the operations are repeated, so that the electric current flowing in the motor is controlled. The reverse electric current flowing in the FWD 88 is the reverse recovery electric current, and a time during which this reverse recovery electric current flows is the "time of reverse recovery".

FIG. 11 illustrates views for explaining behavior of holes flowing in the FWD 88, wherein (a) is a view at the time of electrifying and (b) is a view at the time of reverse recovery.

In FIG. 11, the behavior of the holes flowing in the FWD 88, especially, the behavior in an area from the active part 64 through the edge termination structure 67 is illustrated. Incidentally, while accumulation of hole-electron pairs is caused in the n-drift region 52 below the active part 64 at the time of electrifying, the illustration is omitted.

At the time of electrifying in FIG. 11, part (a), the holes are injected from the p-anode region 54 into the n-drift region 52 and the n$^-$-region 53 as the extending part of the n-drift region 52, (see a symbol 71 in FIG. 11, part (a)). The electrons are injected from the n-cathode region 65 into the n-drift region 52 and the n$^-$-region 53 so as to neutralize the holes. As a result, a forward electric current flows in the n-drift region 52 and the n$^-$-region 53 under a state where the excessive holes and the excessive electrons exist (under a state with hole-electron pairs accumulated). Such a state where the forward electric current flows with those excessive holes and electrons existed is called a conductivity modulation, where resistances in the n-drift region 52 and the n$^-$-region 53 are greatly reduced. Namely, at the time of electrifying, the excessive holes and electrons are accumulated in the n-drift region 52 and the n$^-$-region 53.

In the reverse recovery of FIG. 11, part (b), the IGBT 87 turns on again, and thus the FWD 88 is shifted into the reverse recovery process where the reverse recovery electric current flows. At the time of this reverse recovery, regarding the holes and the electrons which are accumulated in the n-drift region 52 and the n$^-$-region 53, withdrawal of the holes is carried out in the p-anode region 54 and the anode edge part region 55 (see a symbol 73 in FIG. 11, part (b)), and thus the electrons are withdrawn to the n-cathode region 65, thereby producing the reverse recovery electric current. The reverse recovery electric current is lost at a stage where the excessive holes and electrons come into non-existence in the n-drift region 52 and the n$^-$-region 53, and thus the FWD 88 becomes in the off state.

A pn-junction of the anode edge part region 55 and the n-drift region 52 has a shape of convex in the depth direction. Therefore, electric current tends to concentrate thereto, rather than a flat bottom portion of the p-anode region 54. In addition, the holes accumulated in the n$^-$-region 53 below the edge termination structure 67 flow through the anode edge part region 55 in a concentrated manner at the time of reverse recovery, thereby causing breakdown of the FWD 88.

As a method to make it difficult for the electric current to concentrate into the anode edge part region 55, there is a method of taking an extension structure 68 where a resistance region 56 is provided between the p-anode region 54 and the p-guard ring region 58, which is a part of the edge termination structure 67 (see FIG. 1 of Patent Literature 1 below, for example). In addition, a method has also been disclosed where a lifetime is locally shortened in the p-anode region 54, the edge termination structure 67, and a junction and its vicinity of the n-drift region 52 and the n$^-$-region 53 as the extending part thereof (see FIG. 1 of Patent Literature 2 below, for example).

FIG. 12 is a substantial part cross-sectional view of the FWD 88 having the extension structure 68. A difference between the FWD 88 illustrated in FIG. 12 and the FWD 88 illustrated in FIG. 9 exists where the resistance region 56 into which the p-anode region 54 is extended in a direction toward the outer circumference thereof is provided between the p-anode region 54 and the p-guard ring regions 58, which are the edge termination structure 67. The anode electrode 60 is kept away from the upper surface of the resistance region 56 with an insulating film intervening there between. By applying the extension structure 68, the electric current concentration to an extending edge part region 57 at the time of reverse recovery is alleviated, so that the breakdown of the FWD 88 is prevented.

In addition, Patent Literature 3 below describes a deep intermediate layer that has a lower density than the guard ring and a higher density than an anode lower density layer, for example, in FIG. 3. However, this intermediate layer is not connected to the guard ring. Moreover, a contact edge part is in contact with the lower density layer. Furthermore, Patent Literature 4 below describes an effect due to resistance in the same structure as that in the example in the past, for example, in FIG. 1 and FIG. 5. In addition, Patent Literature 5 below describes a configuration where the contact edge part is covered by a p-ring, which is suggested to have a lower density and deeper diffusion depth than the anode layer.

CITATION LIST

Patent Literature

PTL 1: Japanese Patent No. 3,444,081
PTL 2: JP-A-2005-340528
PTL 3: JP-A-2000-114550
PTL 4: JP-A-2000-49360
PTL 5: JP-A-2009-38213

SUMMARY

However, when the extension structure such as illustrated in FIG. 12 is taken, selecting a resistance value Rpo of the resistance region 56 becomes important. When the resistance value Rpo is not set to be an appropriate value, the electric current concentration tends to occur at the edge part on the edge termination structure 67 side or the active part 64 side in the resistance region 56, so that breakdown is caused in the FWD 88.

FIG. 13 illustrates behavior of holes when the resistance value Rpo of the resistance region 56 is smaller than the appropriate value in the FWD 88 of FIG. 12, wherein part (a) is a view at the time of electrifying and part (b) is a view at the time of reverse recovery. As illustrated in FIG. 13, part (a), the hole injection is carried out in a wider region at the time of electrifying (see the symbol 71 in FIG. 13, part (a)). Element breakdown due to heat generation or the like does not occur, because electric power loss, which corresponds to a product of a rated electric current and a forward direction voltage depression, is sufficiently small.

However, in the FWD 88 illustrated in FIG. 13, the withdrawal of the holes is carried out at the time of reverse recover (see the symbol 73 in FIG. 13, part (b)), the electric current concentration occurs at an extending edge part region 57, which is an edge part of the resistance region 56 whose value Rpo is low. The carriers accumulated in a lower part of the edge termination structure 67 flow from the extending edge part region 57 into the low-resistant resistance region 56, and pass through from the p-anode region 54 into the anode electrode 60. At this time, the carriers accumulated in the n$^-$-region 53 outside of the circumference of the extending edge part region 57 concentrate on the extending edge part region 57. With this electric current concentration, an electric field intensity in the extending edge part region 57 is enhanced in accordance with Poisson's equation, so that the breakdown occurs at the extending edge part region 57.

FIG. 14 illustrates behavior of holes when the resistance value Rpo of the resistance region 56 is greater than the appropriate value in the FWD 88 of FIG. 12, wherein part (a) is a view at the time of electrifying and part (b) is a view at the time of reverse recovery. As illustrated in FIG. 14, part (a), the hole injection is carried out in a wider region at the time of electrifying (see the symbol 71 in FIG. 14, part (a)). However, an amount of injected holes is decreased toward the outer peripheral side of a chip from a contact edge 30 because the resistance Rpo of the resistance region 56 is greater. Even in this case, element breakdown due to heat generation or the like does not occur, because electric power loss, which corresponds to a product of a rated electric current and a forward direction voltage depression, is sufficiently small.

However, in the FWD 88 illustrated in FIG. 14, at the time of reverse recover, as illustrated in FIG. 14, part (b), it becomes difficult for the holes to flow into the resistance region 56 whose value of the resistance Rpo is greater, so that the withdrawal of the holes (see the symbol 73 in FIG. 14, part (b)) does not occur through the resistance region 56. Therefore, all the holes accumulated outside of the circumference of the contact edge 30 concentrate toward the contact edge 30. With this, electric current concentrate excessively to the contact edge 30, which is a connection point of the p-anode region 54 and the resistance region 56, so that the element breakdown occurs at this point. In such a manner, when the value of the resistance Rpo of the resistance region 56 is both smaller and greater, the element breakdown tends to occur at the time of reverse recovery.

An explanation is made about the reason why the electric current tends to concentrate especially to the contact edge 30. FIG. 15 is a schematic view illustrating a relationship between equipotential lines and the withdrawal of the holes at the time of reverse recovery (see the symbol 73 in FIG. 14, part (b)) in a diode of FIG. 14, part (b). In FIG. 15, equipotential lines 41 are bowed toward the active part in a direction toward the outer periphery of the chip from the contact edge 30, as illustrated, and therefore gradients thereof concentrate toward the contact edge 30. Symbols 23 illustrate the withdrawal of the holes. the holes run down along the gradients of the equipotential lines 41 (potential) in a space charge region, and therefore all the holes accumulated in the outer peripheral side of the chip from the contact edge 30 concentrate to the contact edge 30.

In order to address the problems in the technology in the past as described above, an aspect of the present invention is to provide a semiconductor device that averts an electric current concentration that tends to occur in a boundary between an edge termination structure region and an active part, and has a high reverse recovery tolerance.

In order to address the above-mentioned problems, in a first aspect of the present invention, a semiconductor device is provided with a first semiconductor region of a second conductive type on a first primary surface of a semiconductor substrate of a first conductive type, and with a plurality of second semiconductor regions of the second conductive type, which constitutes an edge termination structure disposed so as to surround the first semiconductor region. In addition, the semiconductor device is provided with a first primary electrode that is electrically connected to the first semiconductor region on the first primary surface, and with a third semiconductor region of the second conductive type, the third semiconductor region being a resistance region kept away from the first primary electrode in a depth direction with an insulating film intervening there between the first semiconductor region and the second semiconductor region. And this semiconductor device is provided with two or more diffusion regions of the second conductive type, other than the third semiconductor region, the diffusion regions having different resistances and being formed in an upper surface of the semiconductor substrate in a direction toward an outer circumference farther from an outer circumferential edge part with which the first primary electrode is in contact, and is configured so that either one of the third semiconductor region and the two or more diffusion regions of the second conductive type is connected to the first semiconductor region.

In a second aspect of the present invention, it a diffusion depth of at least one region of the third semiconductor region and the two or more diffusion regions of the second conductive type is deeper than a diffusion depth of the remaining regions, and deeper than a diffusion depth of the first semiconductor region, in the above semiconductor device.

In a third aspect of the present invention, when a first diffusion region of the two or more diffusion regions of the second conductive type is a fourth semiconductor region of the second conductive type, the fourth semiconductor region being in conjunction with and between the third semiconductor region and the first semiconductor region; a second diffusion region of the two or more diffusion regions of the second conductive type is a fifth semiconductor region of the second conductive type, the fifth semiconductor region having a higher impurity density than and a deeper diffusion depth than the third semiconductor region in the second semiconductor region side; a diffusion depth of the fourth semiconductor region is deeper than a diffusion depth of the third semiconductor region; and an impurity density in the fourth semiconductor region is lower than an impurity density of the third semiconductor region, in the above semiconductor device.

In a fourth aspect of the present invention, when a width of the fifth semiconductor region in the direction toward the outer circumference is 5 µm or more and 50 µm or less, in the above semiconductor device.

In a fifth aspect of the present invention, when an integral density along a depth direction in the third semiconductor region is greater than the impurity density in the first semiconductor region; a first diffusion region of the two or more diffusion regions of the second conductive type is a fifth semiconductor region of the second conductive type, the fifth semiconductor region having a deeper diffusion depth and a higher impurity density than the third semiconductor region, and being connected to an outer circumferential side of the third semiconductor region; and a second diffusion region of the two or more diffusion regions of the second conductive type is a part into which the first semiconductor region extends from the outer circumferential edge part of the first primary electrode in the direction toward the outer circumference, and that is connected to the third semiconductor region, in the above semiconductor device.

In a sixth aspect of the present invention, when a length of the extending part of the first semiconductor region is 2 µm or more and less than 50 µm, in the above semiconductor device.

In a seventh aspect of the present invention, when the third semiconductor region is a part into which the first semiconductor region extends in the direction toward the outer circumference from the outer circumferential edge part of the first primary electrode; a first diffusion region of the two or more diffusion regions of the second conductive type is a fifth semiconductor region of the second conductive type, the fifth semiconductor region having a deeper diffusion depth than and a higher impurity density than the third semiconductor region, and being connected to an outer circumferential side of the third semiconductor region; a second diffusion region of the two or more diffusion regions of the second conductive type is a sixth semiconductor region of the second conductive type, the sixth semiconductor region being disposed so as to go through the third semiconductor region from an upper surface of the third semiconductor region that is in contact with the insulating film; and an impurity density in the sixth semiconductor region is higher than the impurity density in the third semiconductor region, in the above semiconductor device.

In a eighth aspect of the present invention, when the impurity density and the diffusion depth of the third semiconductor region disposed between the first semiconductor region and the six semiconductor region is the same as the impurity density and the diffusion depth of the first semiconductor region, respectively, in the above semiconductor device.

In a ninth aspect of the present invention, when the impurity density and the diffusion depth of the third semiconductor region is the same as the impurity density and the diffusion depth of the first semiconductor region, respectively, in the above semiconductor device.

In a tenth aspect of the present invention, when a reverse recovery current is made separated to an inner circumferential side than the outer circumferential edge part of the first primary electrode by providing the second conductive type diffusion region, in the above semiconductor device.

According to embodiments of the present invention, a resistance region is provided between a p-anode region and p-guard ring regions, which are part of the edge termination structure, and further a low-density p-diffusion region that is in contact with the p-anode region and the resistance region is provided. In addition, by providing a high-density region in a surface layer of the p-diffusion region, electric current concentration to a contact edge part and around of an anode electrode is suppressed.

In addition, according to embodiments of the present invention, by disposing a resistance region that has a deeper diffusion depth than the p-anode region and a shallower diffusion depth than the p-guard ring regions so as to be in contact with the p-anode region and the p-guard ring region, and further by receding an edge part of a point where the p-anode region is in contact with the anode electrode in an inward direction from an edge part of the p-anode region so that a receding amount thereof is from 2 μm to 50 μm, the electric current concentration to the contact edge portion and around of the anode-electrode is suppressed.

In addition, according to embodiments of the present invention, by providing in the resistance region a high-density region that has a higher density than and a deeper diffusion depth than the resistance region, the electric current concentration to the contact edge portion and around of the anode-electrode is suppressed.

According to embodiments the present invention, a semiconductor device exhibits advantageous effects of having a high reverse recovery tolerance because it averts electric current concentration that tends to occur in a boundary between an active part and an edge termination structure region.

BRIEF DESCRIPTION OF THE DRAWINGS

These and/or other aspects and advantages will become apparent and more readily appreciated from the following description of the embodiments, taken in conjunction with the accompanying drawings of which:

FIG. 10 is an explanatory view illustrating a voltage-current waveform of the FWD 88 and an IGBT 87.

FIG. 15 is a schematic view illustrating a relationship between equipotential lines and withdrawal of holes (see a symbol 73 in FIG. 14, part (b)) at the time of reverse recovery in a diode of FIG. 14, part (b).

FIG. 16 is a schematic view illustrating a relationship between the equipotential lines 41 and withdrawal of holes (see a symbol 23 in FIG. 16) at the time of reverse recovery in a cross section of diode of Example 1.

DESCRIPTION OF EMBODIMENTS

Embodiments are explained by way of the following examples. In the following explanations, "p" given at a beginning of a region indicates that conductivity thereof is p-type, and "n" indicates that conductivity is n-type. In addition, in the following explanations, a state where a wafer serving as a semiconductor substrate is diced into each semiconductor device is explained as a chip.

Example 1

Figure 1:
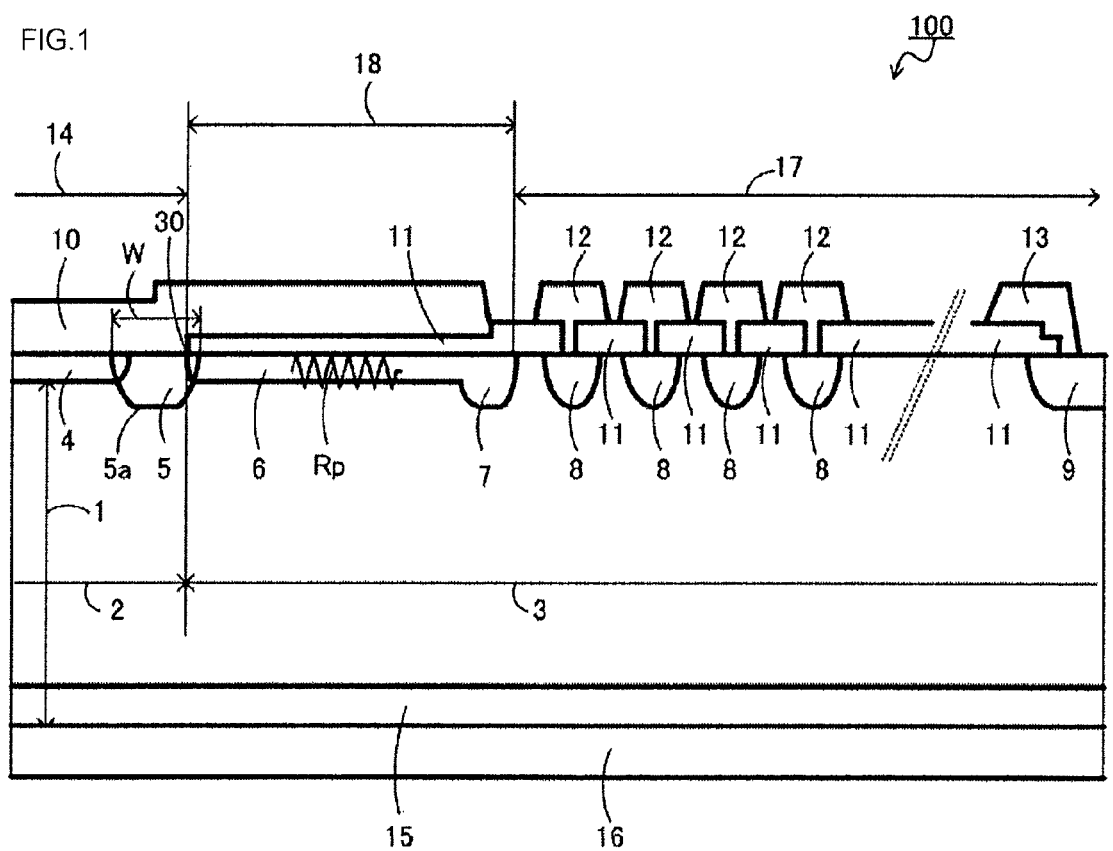
FIG. 1 is a substantial part cross-sectional view of a semiconductor device 100 according to Example 1 of the present invention.
Figure 8:
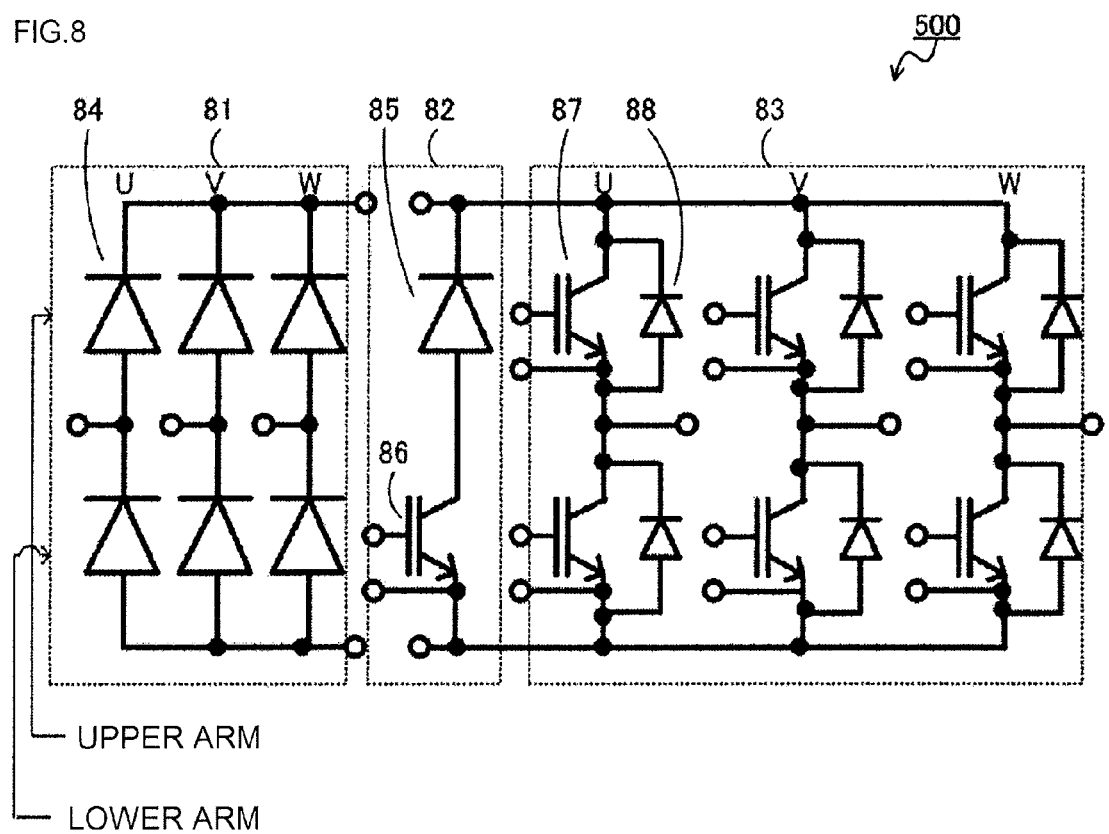
FIG. 8 is a substantial part circuit diagram of a power semiconductor module 500.
Figure 9:
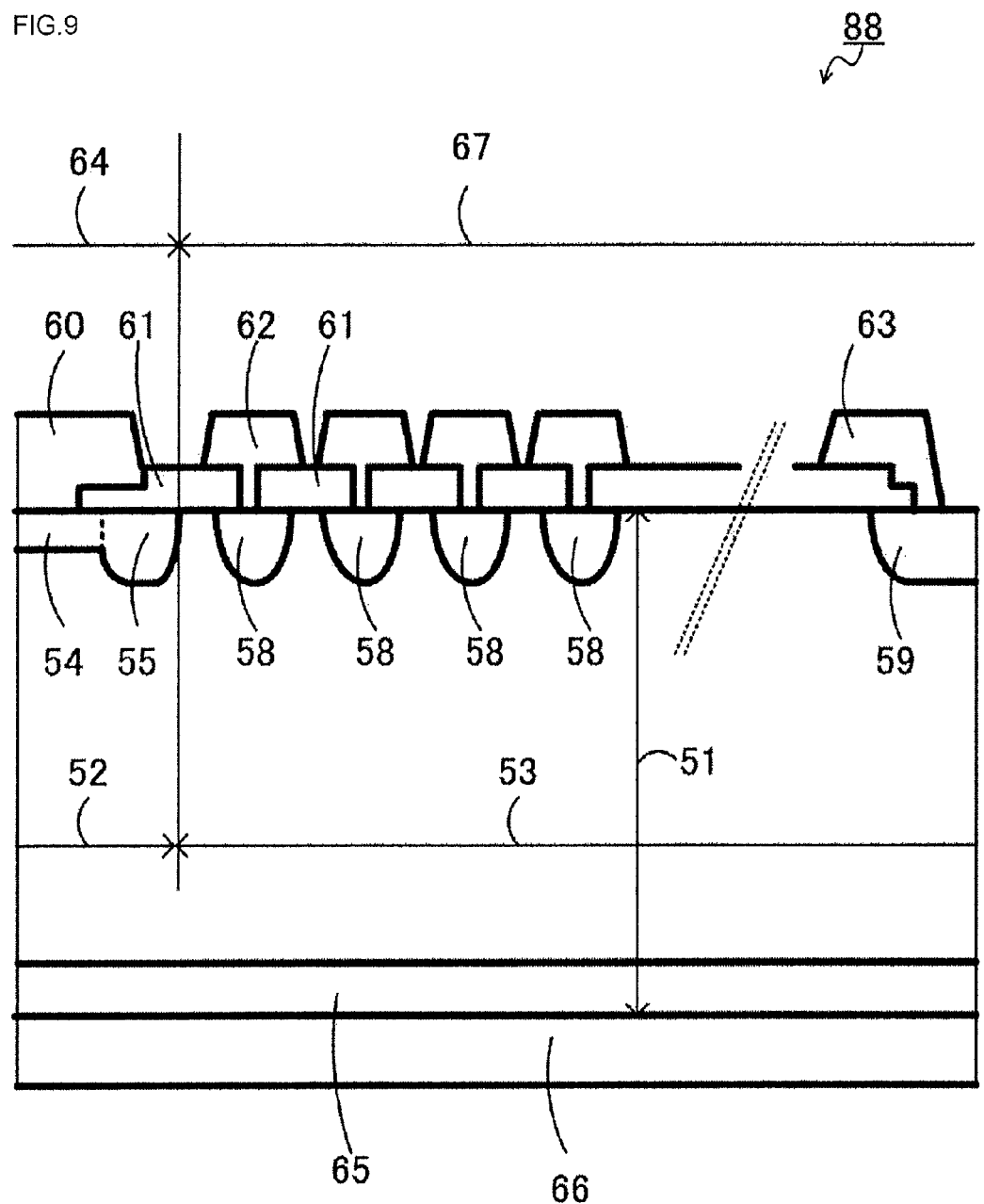
FIG. 9 is a substantial part cross-sectional view of an FWD 88 in the past.

FIG. 1 is a substantial part cross-sectional view of a semiconductor device 100 according to Example 1 of the present invention. FIG. 1 illustrates a substantial part cross section of an FWD corresponding to an FWD 88 of FIG. 8, specifically the substantial part cross section of the semiconductor device from the vicinity thereof of an active part edge part through an outer circumferential part of the semiconductor substrate. In FIG. 1, the semiconductor device 100 is provided with a p-anode region 4 (an example of a first semiconductor region of a second conductive type) disposed on an upper surface of an n-drift region 2 (an example of a semiconductor substrate of a first conductive type). On the n-drift region 2, a p-diffusion region 5 (an example of one of the diffusion regions of the second conductive type) is provided which is disposed so as to be in contact with the p-anode region 4 and has a lower density and a deeper diffusion depth than the p-anode region 4. In an $n^-$-region 3 as an extensive part of the n-drift region 2, an edge termination structure 17 and the like are formed.

On the $n^-$-region 3, a resistance region 6 (an example a third semiconductor region of the second conductive type) disposed so as to be in contact with the p-diffusion region 5, a resistance edge part region 7 (an example of one of the diffusion regions of the second conductive type) disposed so as to be in contact with the resistance region 6, a plurality of p-guard ring regions 8 (examples of second semiconductor regions of the second conductive type) disposed so as to be away from the resistance edge part region 7, and a p-stopper region 9 disposed so as to be away from the p-guard ring regions 8 are provided. Each region formed in an n-type semiconductor substrate 1 is not formed in the n-drift region 2 and the $n^-$-region 3 as the extensive part thereof in the n-semiconductor substrate 1.

In addition, the semiconductor device 100 is provided with an anode electrode 10 (an example of a first primary electrode) disposed so as to be electrically connected to the p-diffusion region 5 and the p-anode region 4. In the following explanations, an edge part of a contact surface in which the anode electrode 10 is connected to an upper surface of the p-anode region 4 or the p-type diffusion layer connected thereto is called a contact edge 30. In addition, in the following explanations, a region from the contact edge 30 through an outer circumferential edge part of the resistance edge part region 7 in a direction toward the outer peripheral side of the chip is called a buffer region 18.

One characteristic is that the semiconductor device 100 has three or more p-type regions having different electrical resistances (simply referred to as resistance(s), hereinafter) in the buffer region 18. The semiconductor device 100 of Example 1 has three regions of the p-diffusion region 5 connected to the contact edge 30, the resistance region 6 connected to the p-type diffusion region at the circumferential side thereof, and the resistance edge part region 7 connected to the resistance region 6 at the circumferential side thereof.

The resistances being different means, specifically, that integral densities obtained by integrating impurity (doping) density in the depth direction from the surface of the semiconductor substrate in each of the three regions are different. In addition, a sheet resistance in each of the three regions is a reverse of a value obtained by multiplying a carrier mobility (a hole in the case of a p-type layer) and the elementary charge with the integral density, and therefore it may be said that the sheet resistances of the three regions are different. Incidentally, two of the three regions may have the same resistance (the integral density, the sheet resistance). It may be sufficient that there are three p-type regions having at least different two types of resistance values.

The semiconductor device 100 is provided with an insulating film 11 disposed on the p-stopper region 9, the p-guard ring regions 8, the resistance edge part region 7, the resistance region 6, and the $n^-$-region 3. In addition, the semiconductor device 100 is provided with a guard ring electrodes 12 disposed on the insulating film 11 so as to be electrically connected to the p-guard ring regions 8, and a stop electrode 13 disposed on and so as to be electrically connected to the p-stopper region 9. As the insulating film 11, there are a PSG (phosphorus glass) film, a thermal oxide film (including a field oxide film), and a multiple film of an oxide film and the PSG film. While FIG. 1 illustrates a single layer insulating film, it may be sufficient to be a composite film obtained by forming only the thermal oxide film in a thinner area and by depositing the PSG film on the thermal oxide film in a thicker area.

The semiconductor device 100 is provided with an n-cathode region 15 disposed below the n-drift region 2 and the $n^-$-region 3 as the extending part thereof, and a cathode electrode 16 disposed so as to be electrically connected to the n-cathode region 15. No diffusion region is formed at the n-drift region 2 and the $n^-$-region 3 as the extending part in the n-semiconductor substrate 1. Impurity densities in the n-drift region 2 and the $n^-$-region 3 as the extending part are the same as an impurity density in the n-semiconductor substrate 1, and are, for example, about $10^{13}$ cm$^{-3}$. The impurity densities in the n-drift region 2 and the $n^-$-region 3 as the extending part may be different from the impurity density in the n-semiconductor substrate 1.

The p-anode region 4 may have an impurity density of, for example, about $2\times10^{16}$ cm$^{-3}$ (for example, $3\times10^{15}$ cm$^{-3}$ to $1\times10^{17}$ cm$^{-3}$), and may have a diffusion depth of, for example, about 5 μm (for example, 3 μm to 7 μm). In this case, the integral density in the p-anode region 4 is about $4\times10^{12}$ cm$^{-2}$ (for example, $4\times10^{11}$ cm$^{-2}$ to $3\times10^{13}$ cm$^{-2}$), and a sheet resistance is about 4000Ω/ (for example, 1000Ω/ to 30000Ω/) under an assumption that the diffusion distribution is in the form of Gaussian.

The p-guard ring regions 8 is a p-region (P+) of which impurity density is high. The p-guard ring regions 8 may have an impurity density of, for example, about $10^{18}$ cm$^{-3}$ to $10^{19}$ cm$^{-3}$ or greater, and may have a diffusion depth of, for example, about 10 μm (for example, 7 μm to 15 μm). In this case, the integral density in the p-guard ring regions 8 is about $3\times10^{14}$ cm$^{-2}$ (for example, $2\times10^{14}$ cm$^{-2}$ to $4\times10^{15}$ cm$^{-2}$), and the sheet resistance is about 220Ω/ (for example, 30Ω/ to 300Ω/).

The resistance edge part region 7 is a p-region having the same impurity density and diffusion depth as those of the p-guard ring regions 8. This resistance edge part region 7 may be considered as a part of the p-guard ring regions 8. The resistance region 6 may be a p-region (p) having an impurity density of about $10^{17}$ cm$^{-3}$ (for example, $3\times10^{16}$ cm$^{-3}$ to $3\times10^{17}$ cm$^{-3}$) and a diffusion depth of, for example, 7 μm (for example, 5 μm to 10 μm). In this case, the integral density in the resistance region 6 is about $2.5\times10^{13}$ cm$^{-2}$ (for example, $5\times10^{12}$ cm$^{-2}$ to $1\times10^{14}$ cm$^{-2}$) and the sheet resistance of about 1100Ω/ (for example, 400Ω/ to 3000Ω/).

The p-diffusion region 5 is a low-density p-region (p$^-$). The p-diffusion region 5 may be the low-density p-region ($p^-$) having an impurity density of, for example, $3\times10^{15}$ cm$^{-3}$ (for example, $10^{15}$ cm$^{-3}$ to $10^{16}$ cm$^{-3}$) and a diffusion depth of, for example, 10 μm (8 μm or more and 15 μm or less). In this case, the integral density in the p-diffusion region 5 is about $1.4\times10^{12}$ cm$^{-2}$ (for example, $4\times10^{11}$ cm$^{-2}$ to $6\times10^{12}$ cm$^{-2}$) and the sheet resistance is about 10000Ω/ (for example, 2000Ω/ to 30000Ω/), which are lower than the impurity density of the resistance region 6 and deeper than the depth of the resistance region 6, respectively. The p-diffusion region 5 has a function that suppresses the injection of the holes into the n$^-$-region 3 thereby to decrease an amount of the accumulated holes and thus alleviates the electric current concentration in the p-anode region 4 at the time of reverse recovery.

In order to flatten a bottom part 5a of the p-diffusion region 5, the width may preferably be in a range from 5 μm to 50 μm. When less than 5 μm, a degree of flatness is too low, and thus the electric current concentration becomes significant at this point. On the other hand, when exceeding 50 μm, an area of the p-anode region 4 becomes small, an on voltage of the FWD is increased. In addition, the range may preferably from 10 μm to 30 μm. In the semiconductor device 100, the p-anode region 4 and a part of the p-diffusion region 5 up to the contact edge 30 are assumed to be an active part (or active region) 14. In addition, a region where the p-guard ring regions 8, the p-stopper region 9, and the insulating film 11 are formed is assumed to be the edge termination structure 17.

In a reverse surface of the n-semiconductor substrate 1, a high-density n-cathode region 15 that has an impurity density of about $10^{18}$ cm$^{-3}$ and a diffusion depth of about 1 μm is disposed below the n-drift region 2 and the n$^-$-region 3 as the extending part thereof. A cathode electrode 16 electrically connected to the n-cathode region 15 is provided. The cathode electrode 16 is formed of, for example, a three-layer metal film of Ti/Ni/Au. The anode electrode 10, the guard ring electrodes 12, and the stop electrode 13 are formed of, for example, an Al—Si film.

Figure 2:
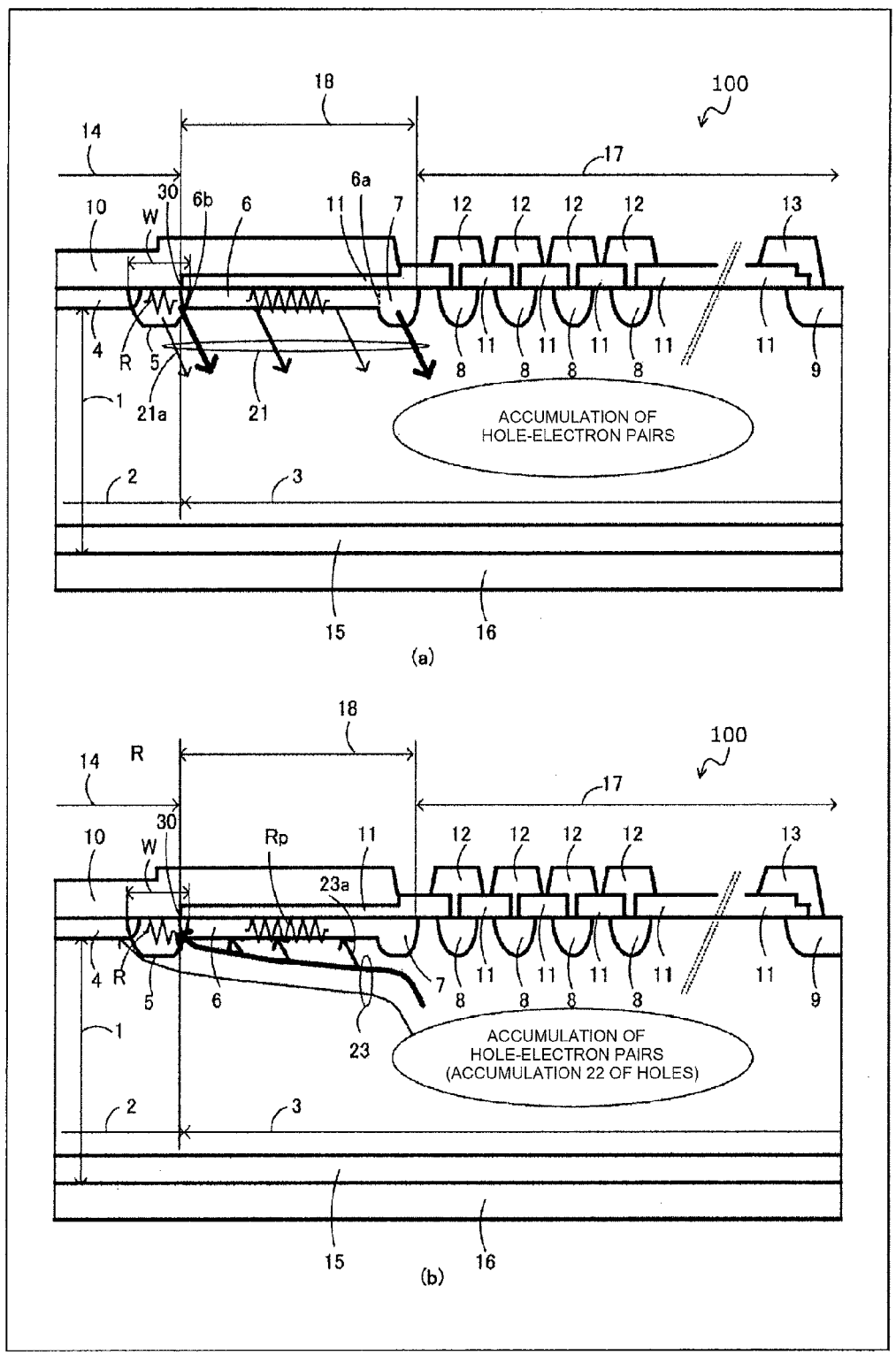
FIG. 2 illustrates views for explaining behavior of holes in a structure of FIG. 1, wherein part (a) is a view at the time of electrifying, and part (b) is a view at the time of reverse recovery.
Figure 11:
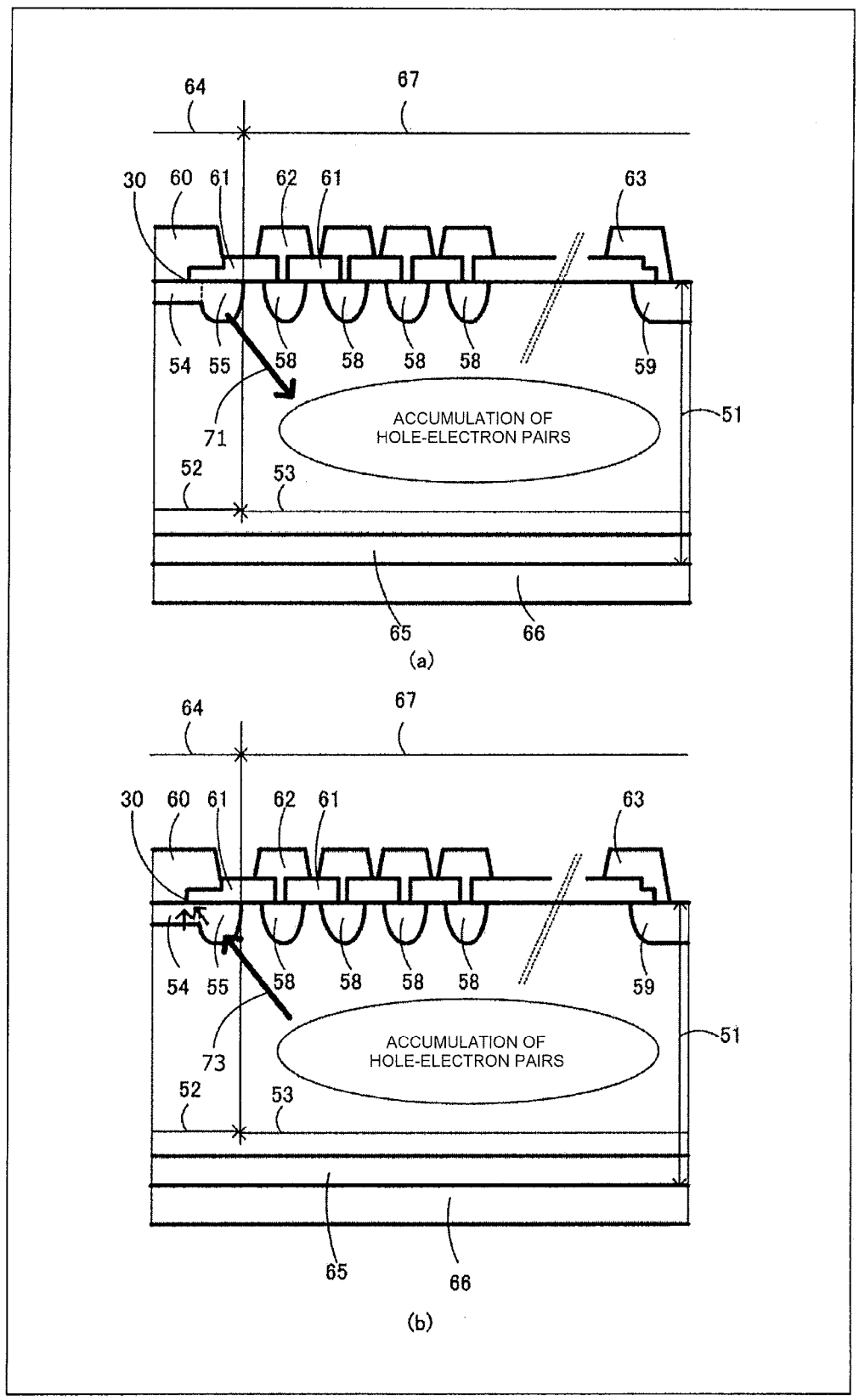
FIG. 11 illustrates views for explaining behavior of holes flowing in the FWD 88, wherein (a) is a view at the time of electrifying, and (b) is a view at the time of reverse recovery.
Figure 12:
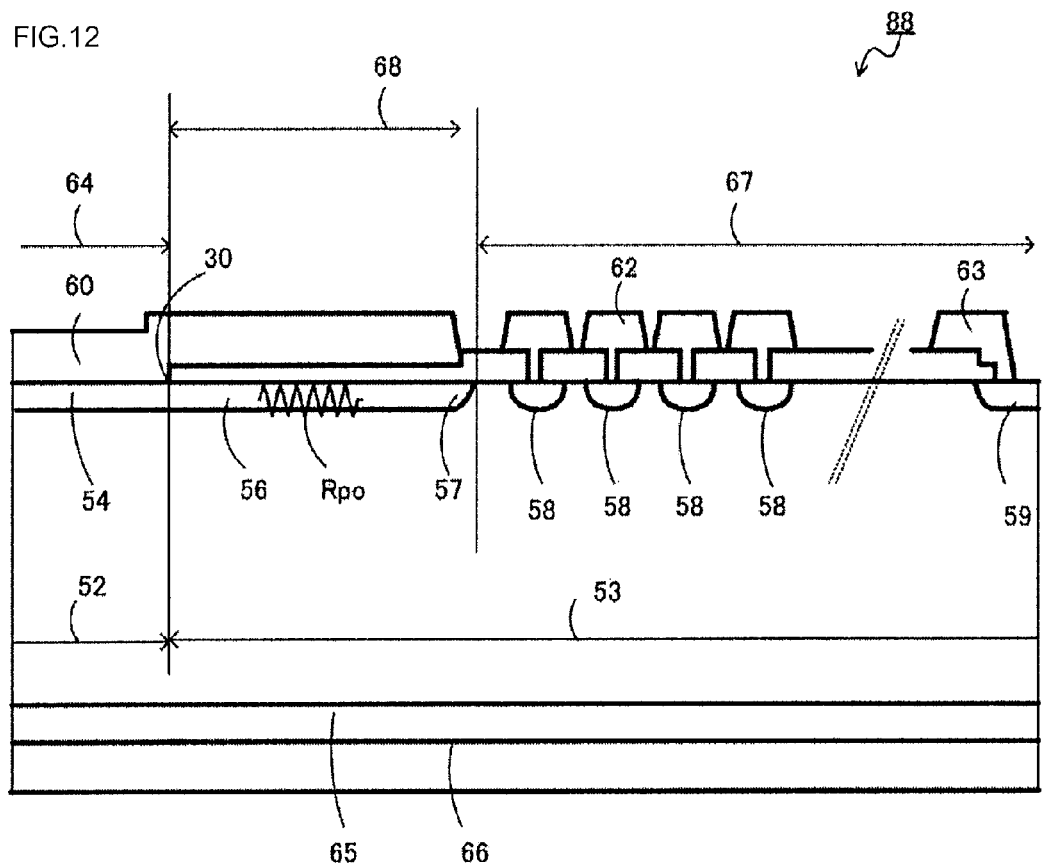
FIG. 12 is a substantial part cross-sectional view of the FWD 88 having an extension structure 68.
Figure 13:
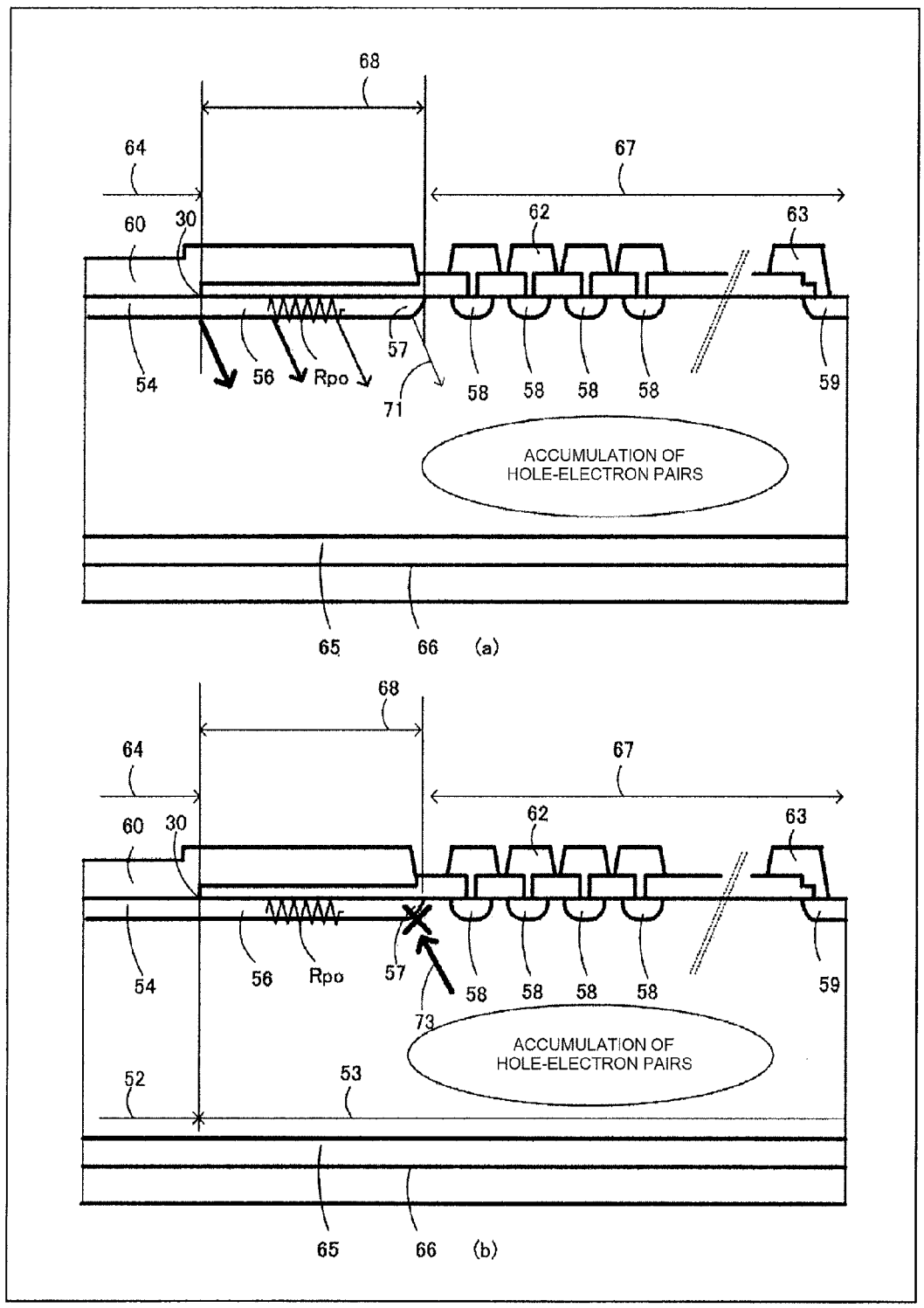
FIG. 13 illustrates behavior of holes in the FWD 88 of FIG. 12, when a resistance value Rpo of a resistance region 56 is smaller than an appropriate value, wherein part (a) is a view at the time of electrifying, and part (b) is a view at the time of reverse recovery.
Figure 14:
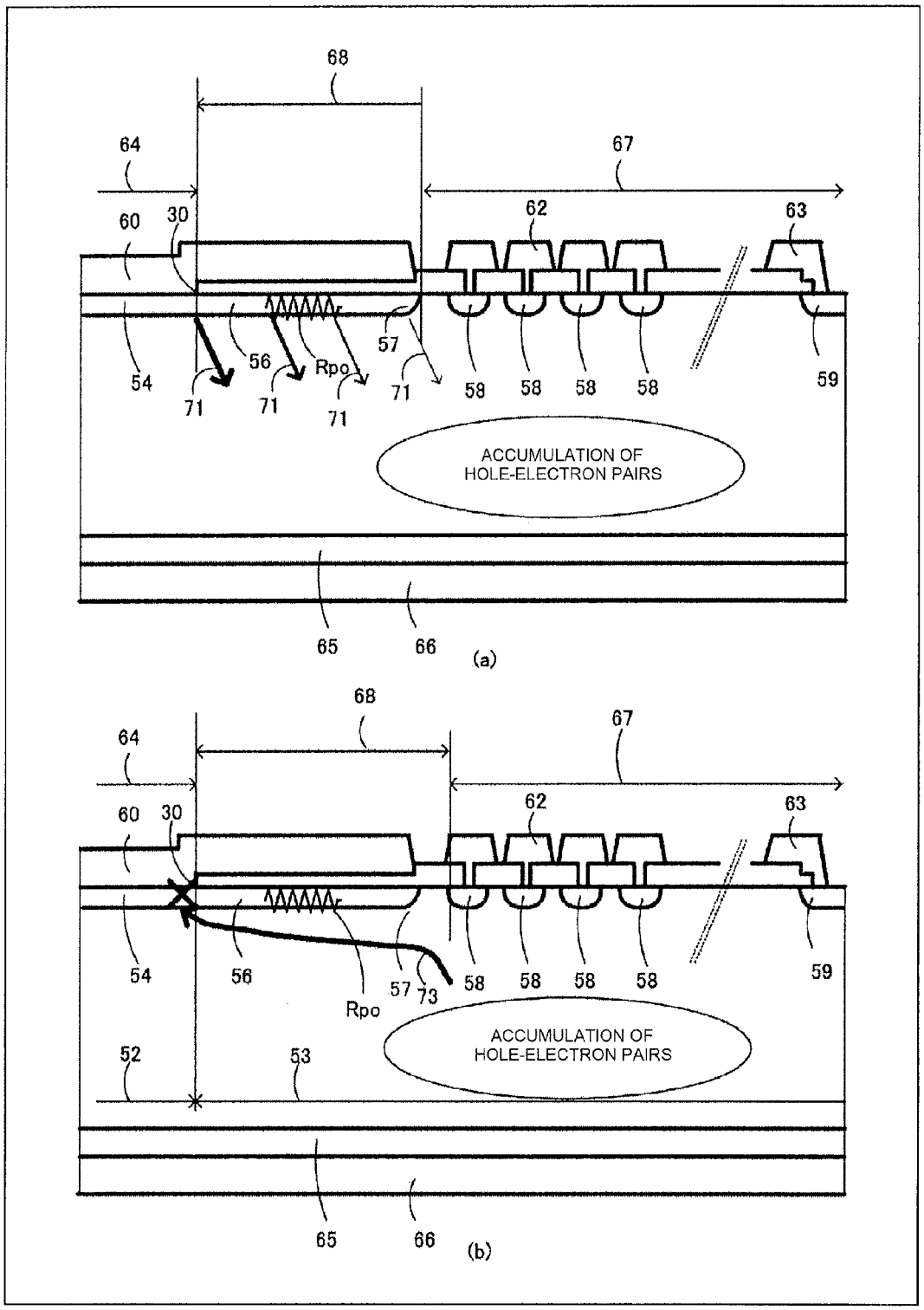
FIG. 14 illustrates behavior of holes in the FWD 88 of FIG. 12, when a resistance value Rpo of the resistance region 56 is greater than an appropriate value, wherein part (a) is a view at the time of electrifying, and part (b) is a view at the time of reverse recovery.

FIG. 2 illustrates views for explaining behavior of holes in the structure of FIG. 1, where part (a) is a view at the time of electrifying and part (b) is a view at the time of reverse recovery. In FIG. 2, while accumulation of hole-electron pairs is caused in the n-drift region 2 below the active part 14 at the time of electrifying, the illustration is omitted, as is the case with FIG. 11. In FIG. 2, part (a), injection 21 of the holes from the p-diffusion region 5 in contact with the resistance region 6 occurs to a less degree than that from the p-anode region 4. In addition, the injection 21 of the holes from the resistance region 6 occurs to a less degree toward the edge termination structure 17 side from the contact edge 30.

On the other hand, the injection 21 of the holes from the resistance edge part region 7 provided adjacent to the innermost circumference of the edge termination structure 17 that is in contact with an outer edge part 6a of the resistance region 6 occurs to a greater degree than the injection 21 of the holes from an inner edge part 6b of the resistance region 6, because the impurity density of the resistance edge part region 7 is greater. Therefore, points where the injection 21 of the holes occurs at a great degree are divided into the inner edge part 6b and the outer edge part 6a of the resistance region 6. In addition, injection 21a of the holes from the p-diffusion region 5 is suppressed because of a low impurity density. Moreover, the p-diffusion region 5 per se functions as an electric current restricting resistance body R because of the low impurity density. Therefore, the injection 21a of the holes from the p-diffusion region 5 that is in contact with the resistance region 6 is suppressed compared with a case where the p-diffusion region 5 is not provided, thereby suppressing the electric current concentration.

In FIG. 2, part (b), accumulated holes 22 that have been accumulated in a lower part of the edge termination structure 17 are withdrawn from the resistance edge part region 7 and the resistance region 6 at the time of reverse recovery. This withdrawal of the holes (see the symbol 23 in FIG. 2, part (b)) causes an electrical potential difference when the holes move to the p-anode region 4 through the resistance region 6, because resistance values Rp are high in the resistance edge part region 7 and the resistance region 6. This electrical potential difference is about 100 to 200 V, although it depends on the resistance of the resistance region 6.

Therefore, an amount of the withdrawn holes is small (see a symbol 23a in FIG. 2, part (b)), and almost all of accumulation 22 of the accumulated holes are withdrawn to the p-diffusion region 5 and the p-anode region 4. In addition, a density in the p-diffusion region 5 is lower than that in the p-anode region 4 and the diffusion depth is deeper than that of the p-anode region 4. Therefore, the accumulation 22 of the accumulated holes not only moves toward the contact edge 30 but also separately toward the p-anode region 4 that is at a more inner position than the p-diffusion region 5. This separate flow alleviates the electric current concentration to the contact edge 30, thereby improving the reverse recovery tolerance.

An explanation is made about the reason why "the separate flow" of the reverse recovery electric current is caused, using FIG. 16. FIG. 16 is a schematic view illustrating a relationship between equipotential lines 41 and the withdrawal of the holes at the time of reverse recovery (see the symbol 23 in FIG. 16) in a cross section of a diode of Example 1. Only the lower voltage side of the equipotential lines 41 is especially illustrated, and the higher voltage side thereof (in the side of the n-cathode region 15) is omitted in the drawing.

At the time of reverse recovery, a line (corresponding to a depletion layer edge) that is at the same potential as the anode electrode 10 in the p-diffusion region 5 lies shallow because of a lower density than that of the p-anode region 4. On the other hand, when the potential is enhanced, the equipotential lines 41 extend along a depth direction because the p-diffusion region 5 is diffused deep. Namely, the equipotential lines 41 lie deeper than the p-anode region 4 and the resistance region 6. With this, a potential slope becomes gentle at the vicinity of the pn-junction in the p-diffusion region 5. Namely, the electric field is weakened. The holes avoid this weakened area and fall down through an area with the highly-sloped potential, namely into the p-anode region 4 side, because the holes run down along the potential slope in a space charge region.

Moreover, the contact edge 30 is positioned inside the low-density p-diffusion region 5. Therefore, the holes are influenced by the high resistance of the p-diffusion region 5, and thus flow from the p-anode region 4, which has a lower resistance than the p-diffusion region 5, to the anode electrode 10. Namely, the hole current is separated so as to flow toward the p-anode region 4 rather than the p-diffusion region 5. Incidentally, the three p-type diffusion regions in the buffer region 18 may have at least two different diffusion depths, other than the integral densities described above, thereby enhancing the effect of the separated flow.

From the above reasons, the holes do not concentrate to the contact edge 30 but flow into the anode electrode 10 from the p-anode region 4, so that the electric current concentration to the contact edge 30 is alleviated, thereby preventing the element breakdown. In addition, as described above, by providing the p-diffusion region 5, the electric current concentration at the time of reverse recovery as well as at the time of electrifying can be prevented. As a result, the semiconductor device 100 having a high reverse recovery tolerance can be produced.

Example 2

Figure 3:
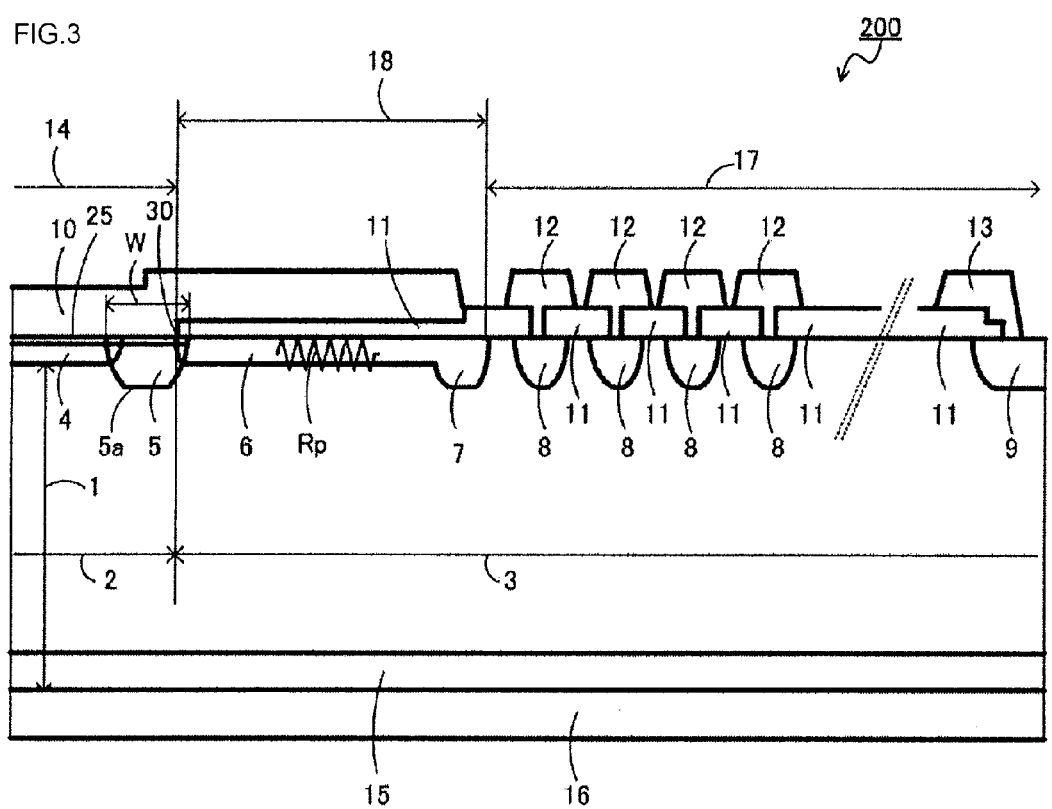
FIG. 3 is a substantial part cross-sectional view of a semiconductor device 200 according to Example 2 of the present invention.

FIG. 3 is a substantial part cross-sectional view of a semiconductor device 200 according to Example 2 of the present invention. A difference relative to Example 1 exists in that a high-density p-region 25 ($p^+$) whose diffusion depth is shallow is formed on the p-diffusion region 5 and the p-anode region 4. When a surface density of the p-diffusion region 5 is low, an ohmic contact to the anode electrode 10 becomes difficult, so that a contact resistance becomes increased. When the contact resistance becomes increased, an amount of the withdrawal holes from the p-diffusion region 5 is decreased, and thus the withdrawal of the holes occurs mostly in the p-anode region 4. Then, the electric current concentration occurs in the p-diffusion region 4, which leads to the element breakdown.

As a countermeasure to prevent this, it is preferable to provide the p-region 25 that has a higher impurity density and a shallower diffusion depth than the p-diffusion region 5, in order to decrease the contact resistance to the anode electrode 10 while keeping low the impurity density in the p-diffusion region 5. By providing the p-region 25, an amount of the withdrawal holes in the p-diffusion region 5 is increased, and thus the electric current concentration in the p-anode region is improved, thereby preventing the element breakdown.

Incidentally, although the impurity densities of the p-guard ring regions 8 are higher and the impurity density of the p-diffusion region 5 is lower in Example 1 and Example 2, the impurity densities of the p-guard ring regions 8 may be matched to the impurity density of the p-diffusion region 5. When matching in such a manner, both can be concurrently formed, so that production costs of the semiconductor devices 100, 200 can be decreased.

Example 3

Figure 4:
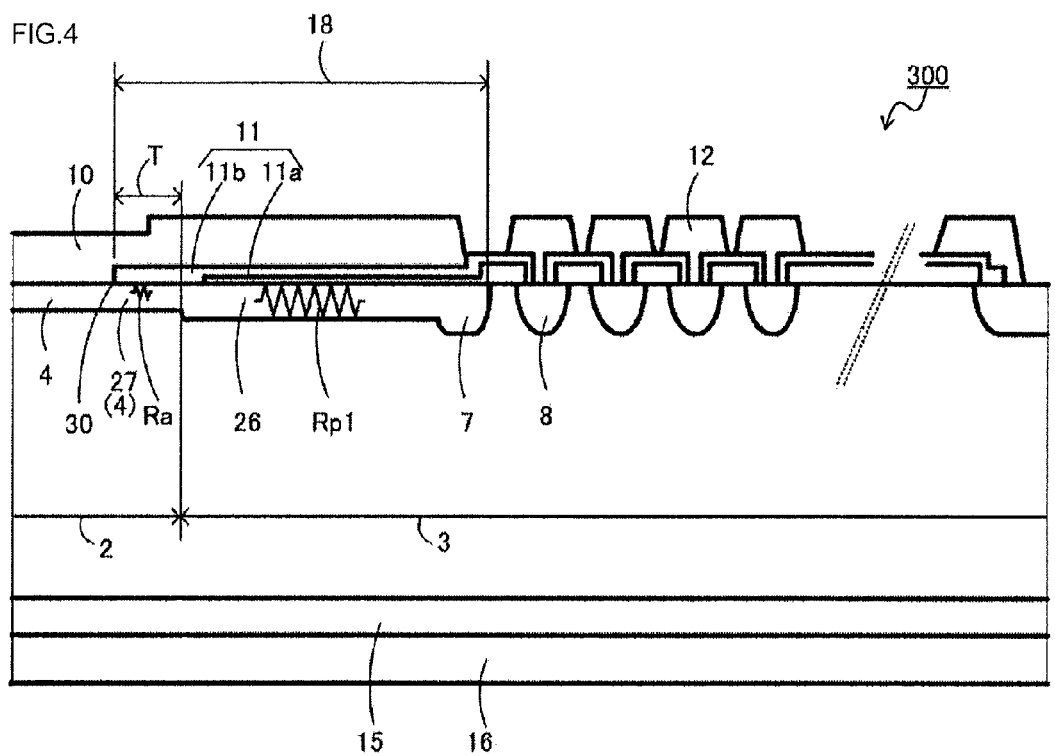
FIG. 4 is a substantial part cross-sectional view of a semiconductor device 300 according to Example 3 of the present invention.

FIG. 4 is a substantial part cross-sectional view of a semiconductor device 300 according to Example 3 of the present invention. The semiconductor device 300 is different from Example 1 in the following two points. A first point is that a resistance region 26, having a deeper diffusion depth than the resistance region 6 and the p-anode region 4 and a shallower diffusion depth than the p-guard ring regions 8, is disposed so as to be in contact with the resistance edge part region 7 and the p-anode region 4. A second point is that an edge part of a location where the p-anode region 4 is in contact with the anode electrode 10 is kept away (receded) from the resistance region 26. In FIG. 4, the insulating film 11 is illustrated as a two-layer insulating film of the PSG film 11b of a phosphorous glass and the thermal oxidation film 11a.

The buffer region 18 in Example 3 has the three different resistance regions. A first resistance region is the p-anode region 4 that extends by a distance T from the contact edge 30 toward (or recedes from) the outer periphery of the chip. A second resistance region is the resistance region 26 that is connected to the extensive part of the p-anode region 4. A third resistance region is the resistance edge part region 7 that is connected to the outer circumferential side of the resistance region 26.

By making the resistance region 26 deeper than the diffusion depth of the p-anode region 4, an amount of the withdrawal holes in the resistance region 26 is increased, so that the withdrawal of the holes, including the p-anode region 4, becomes uniformed. In addition, when the surface impurity density of the resistance region 26 is the same as the surface impurity density of the resistance region 6, a resistance value Rp1 of the resistance region 26 becomes smaller than the resistance value Rp (see FIG. 3) of the resistance region 6, because the diffusion depth of the resistance region 26 is deeper than the diffusion depth of the resistance region 6.

Namely, the integral densities of the p-anode region 4 and the resistance region 26 are different. The resistance edge part region 7 has a concentration as high as and a diffusion depth as deep as the p-guard ring regions 8, so that the resistance value thereof becomes lower. As a result, the hole withdrawal effect is enhanced greater in the resistance region 26 than in the resistance region 6, so that the withdrawal of the holes, including the p-anode region 4, is uniformed.

Incidentally, the diffusion depth of the resistance region 26 may be set to be the same as that of the resistance region 6. However, when set to be the same as that of the resistance region 6, the diffusion depth of the resistance region 26 is made deeper than that of the p-anode region 4. In this element configuration, an outer circumferential part of the p-anode region 4 that is not in contact with the anode electrode 10 works as a resistance body Ra. Namely, a receded point 27 of the p-anode region 4, which recedes from the resistance region 26, works as with the p-diffusion region 5 of Examples 1 and 2.

Figure 17:
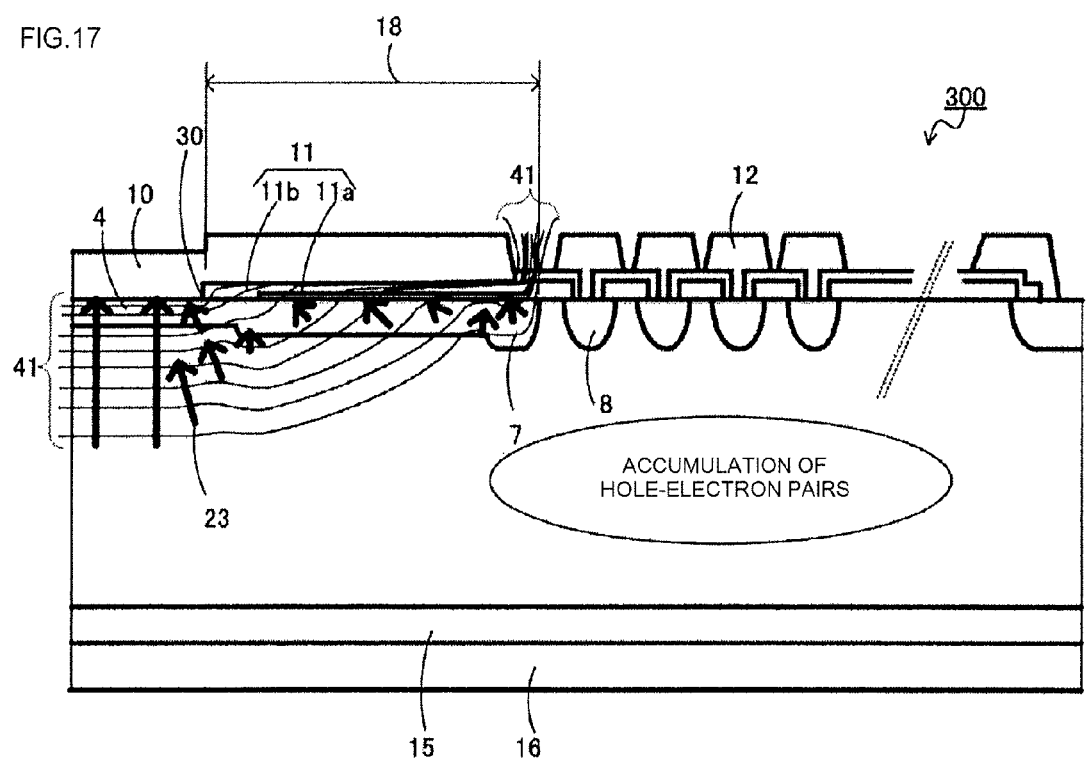
FIG. 17 is a schematic view illustrating a relationship between the equipotential lines 41 and withdrawal of holes (see the symbol 23 in FIG. 17) at the time of reverse recovery in a cross section of diode of Example 3.

An explanation is made about the reason why a diode of Example 3 can alleviate the electric current concentration to the contact edge 30, using FIG. 17. FIG. 17 is a schematic view illustrating a relationship between equipotential lines 41 and the withdrawal of the holes at the time of reverse recovery (see the symbol 23 in FIG. 17) in the cross section of the diode of Example 3. Only the lower voltage side of the equipotential lines 41 is especially illustrated, and the higher voltage side thereof (in the side of the n-cathode region 15) is omitted in the drawing.

An explanation is made about the reason why a diode of Example 3 can alleviate the electric current concentration to the contact edge 30, using FIG. 17. FIG. 17 is a schematic view illustrating a relationship between equipotential lines 41 and the withdrawal of the holes at the time of reverse recovery (see the symbol 23 in FIG. 17) in the cross section of the diode of Example 3. Only the lower voltage side of the equipotential lines 41 is especially illustrated, and the higher voltage side thereof (in the side of the n-cathode region 15) is omitted in the drawing.

Figure 5:
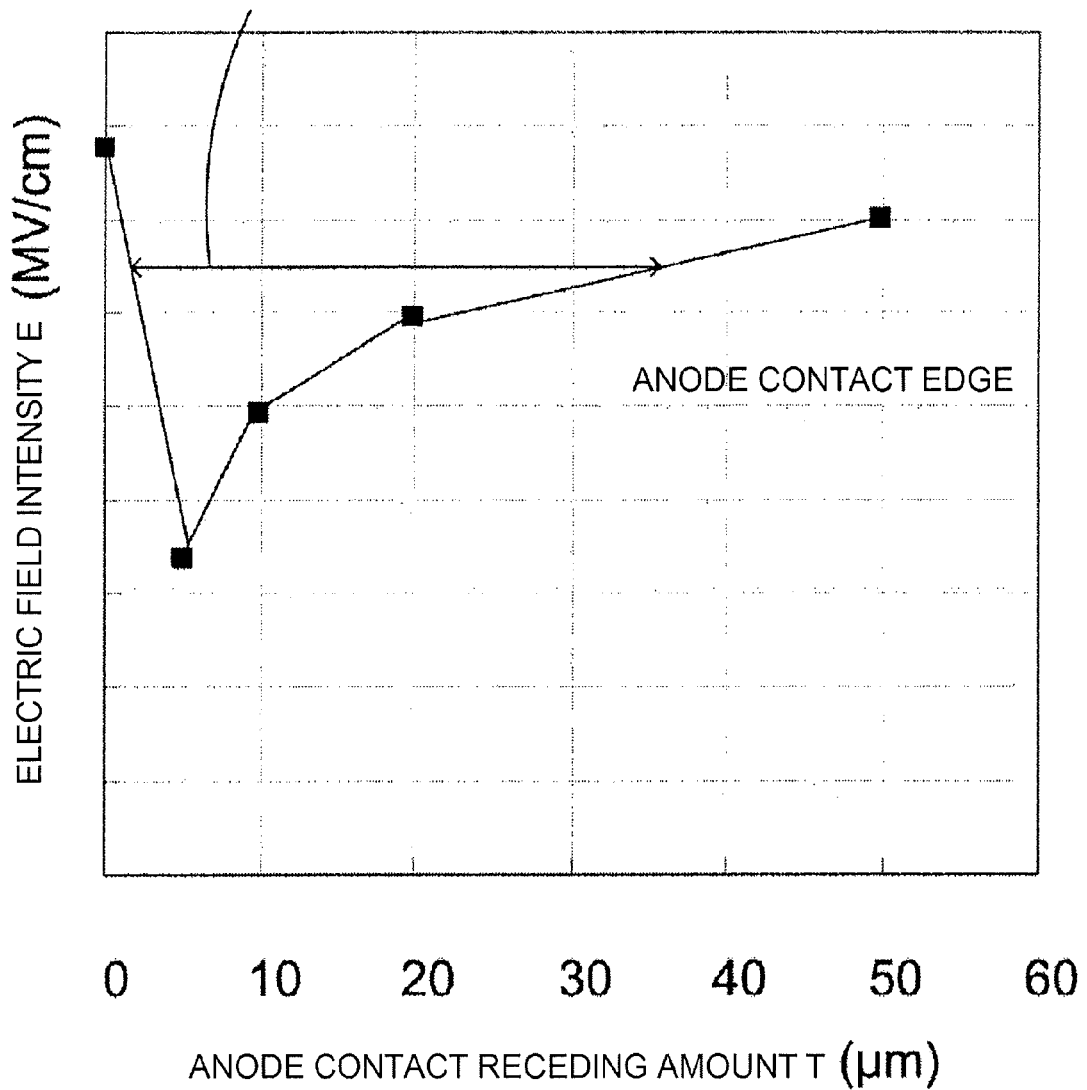
FIG. 5 is a view illustrating a relationship between electric field intensity and a receding amount of an anode contact.

Next, a relationship between the receded amount T and an electric field intensity E is explained. FIG. 5 is a view illustrating the relationship between the receded amount of the anode contact and the electric field intensity. E of a vertical axis is taken in an arbitrary scale. The electric field intensity E is an electric field intensity at the time of reverse recovery. Although the electric field intensity that causes the element breakdown lies outside a range in the view, it should be within the illustrated range of the invention in order to assure high reliability. Namely, it is preferable the receded amount T is set to be in a range from 2 µm to 35 µm. When ranged out from this range, the electric field intensity becomes increased, so that it becomes difficult to obtain a high reliability. In addition, a more preferable range is from 3 μm to 10 μm.

As above, the three p-type diffusion region in the buffer region 18 may have at least two different diffusion depths other than the integrated density, and even with this, the effect of the separated flow can be further enhanced.

Example 4

Figure 6:
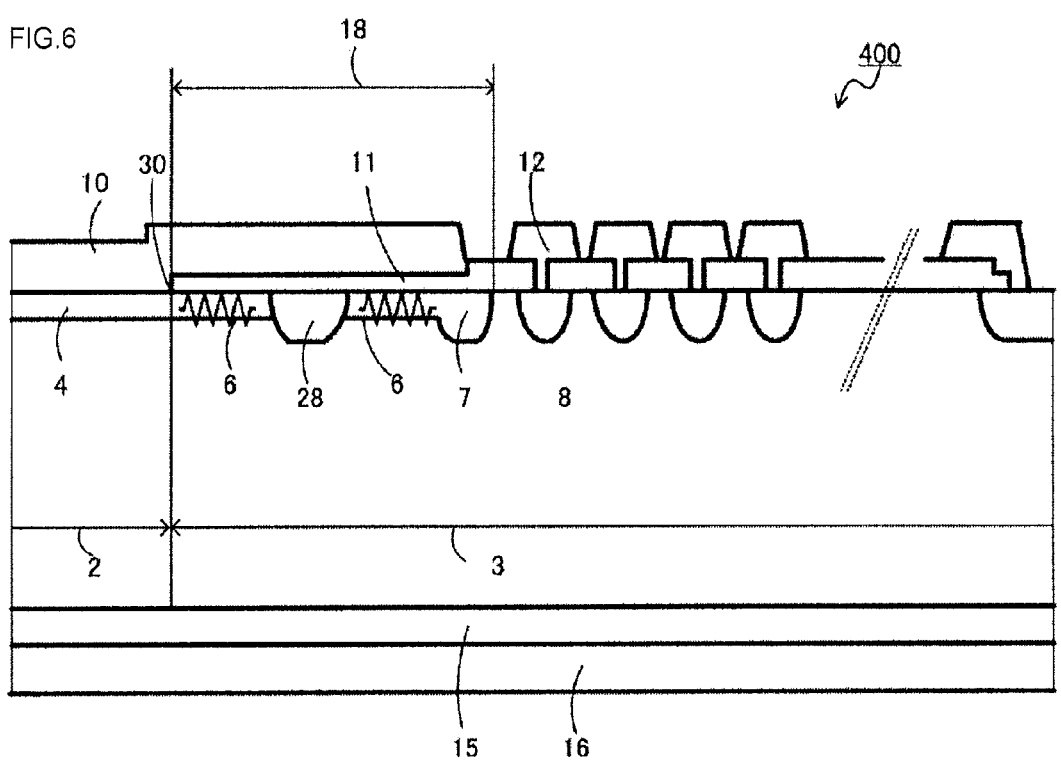
FIG. 6 is a substantial part cross-sectional view of a semiconductor device 400 according to Example 4 of the present invention.

FIG. 6 is a substantial part cross-sectional view of a semiconductor device 400 according to Example 4 of the present invention. Differences relative to Example 1 and Example 2 exist in that the p-diffusion region 5 is removed and a high-density p-diffusion region 28 is disposed in the vicinity of the middle of the resistance region 6. This high-density p-diffusion region 28 has a higher impurity density than and a deeper diffusion depth than the resistance region 6. The electric current concentration is alleviated, thereby preventing the element breakdown, because this high-density p-diffusion region 28 allows the accumulated holes to be efficiently withdrawn.

Incidentally, this high-density p-diffusion region 28 may be arbitrarily disposed as long as the position is within the resistance region 6. In addition, the resistance region 6 disposed between the p-diffusion region 28 and the p-anode region 4 may be formed concurrently with the p-anode region 4, thereby equalizing the impurity densities and the diffusion depths. Moreover, the entire resistance region 6 is formed concurrently with the p-anode region 4, thereby equalizing the impurity densities and the diffusion depths. In these cases, the producing process is simplified, thereby reducing production costs.

The buffer region 18 in Example 4 also has the three different resistance regions. A first resistance region is the resistance region 6 into which the p-anode region 4 extends from the contact edge 30 in the direction toward the outer peripheral side of the chip. A second resistance region is the p-diffusion region 28 that is connected to the extensive part of the p-anode region 4. A third resistance region is the resistance region 6 that is the same as the first resistance region. In this case, the buffer region 18 has two different resistance values, one in the resistance region 6, which has the same density as the p-anode region 4, and the other in the p-diffusion region 28.

Figure 18:
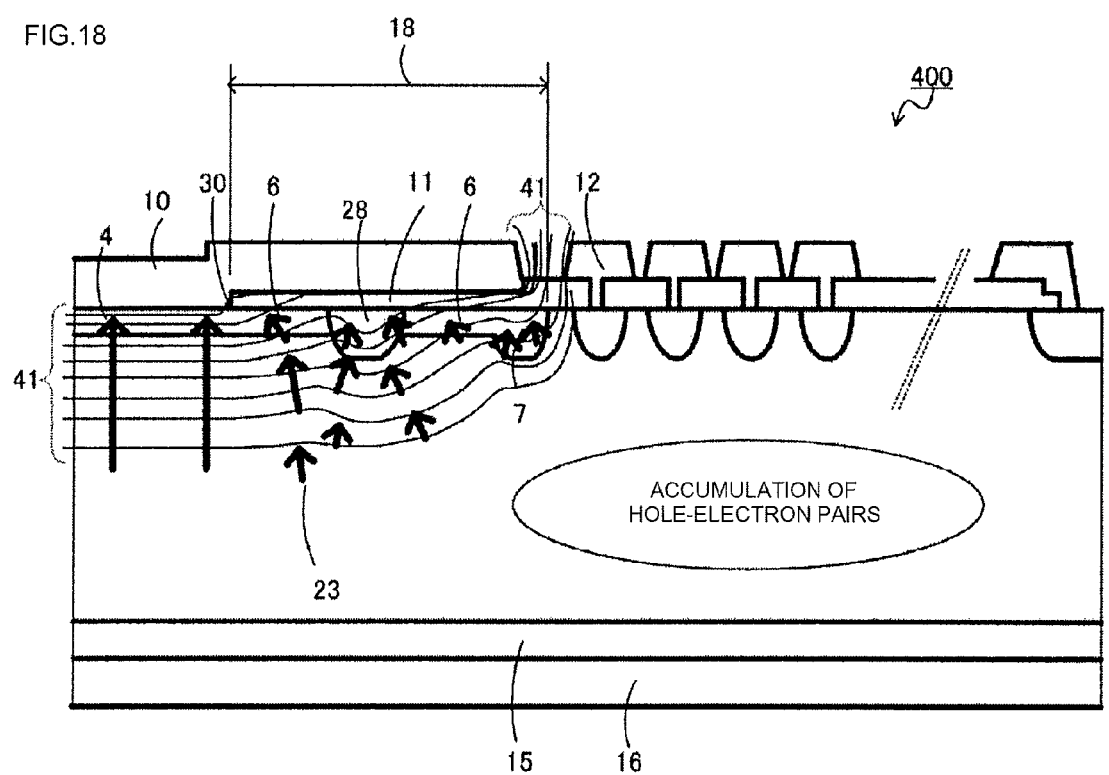
FIG. 18 is a schematic view illustrating a relationship between the equipotential lines 41 and withdrawal of holes (see the symbol 23 in FIG. 18) at the time of reverse recovery in a cross section of diode of Example 4.

An explanation is made about the reason why a diode of Example 4 can alleviate the electric current concentration to the contact edge 30, using FIG. 18. FIG. 18 is a schematic view illustrating a relationship between equipotential lines 41 and the withdrawal of the holes at the time of reverse recovery (see the symbol 23 in FIG. 18) in the cross section of the diode of Example 4. Only the lower voltage side of the equipotential lines 41 is especially illustrated, and the higher voltage side thereof (in the side of the n-cathode region 15) is omitted in the drawing.

The equipotential lines 41 at the time of reverse recovery are pushed out toward the n-drift region 2 in the p-diffusion region 28 that has a deeper diffusion depth than the p-anode region 4 and the resistance region 6. Namely, as is the case with Example 1, the equipotential lines 41 are distributed at wider intervals in the vicinity of the boundary between the resistance region 6 and the p-diffusion region 28, thereby alleviating the potential slope. As a result, withdrawal 23 of the holes is separated toward the p-anode 4 rather than the contact edge 30. With this, the holes do not concentrate to the contact edge 30 but flow from the p-anode region 4 to the anode electrode 10, so that the electric current concentration to the contact edge 30 is alleviated, thereby preventing the element breakdown.

In addition, the p-diffusion region 28 can enhance the effect of the separated flow, when formed in the side of the p-anode region 4 rather than in the middle position of the resistance region 6 along the direction toward the outer periphery of the chip. Moreover, as described above, the three p-type diffusion regions of the buffer region 18 may have at least two different diffusion depths, other than the integral density, thereby further enhancing the effect of the separated flow.

Figure 7:
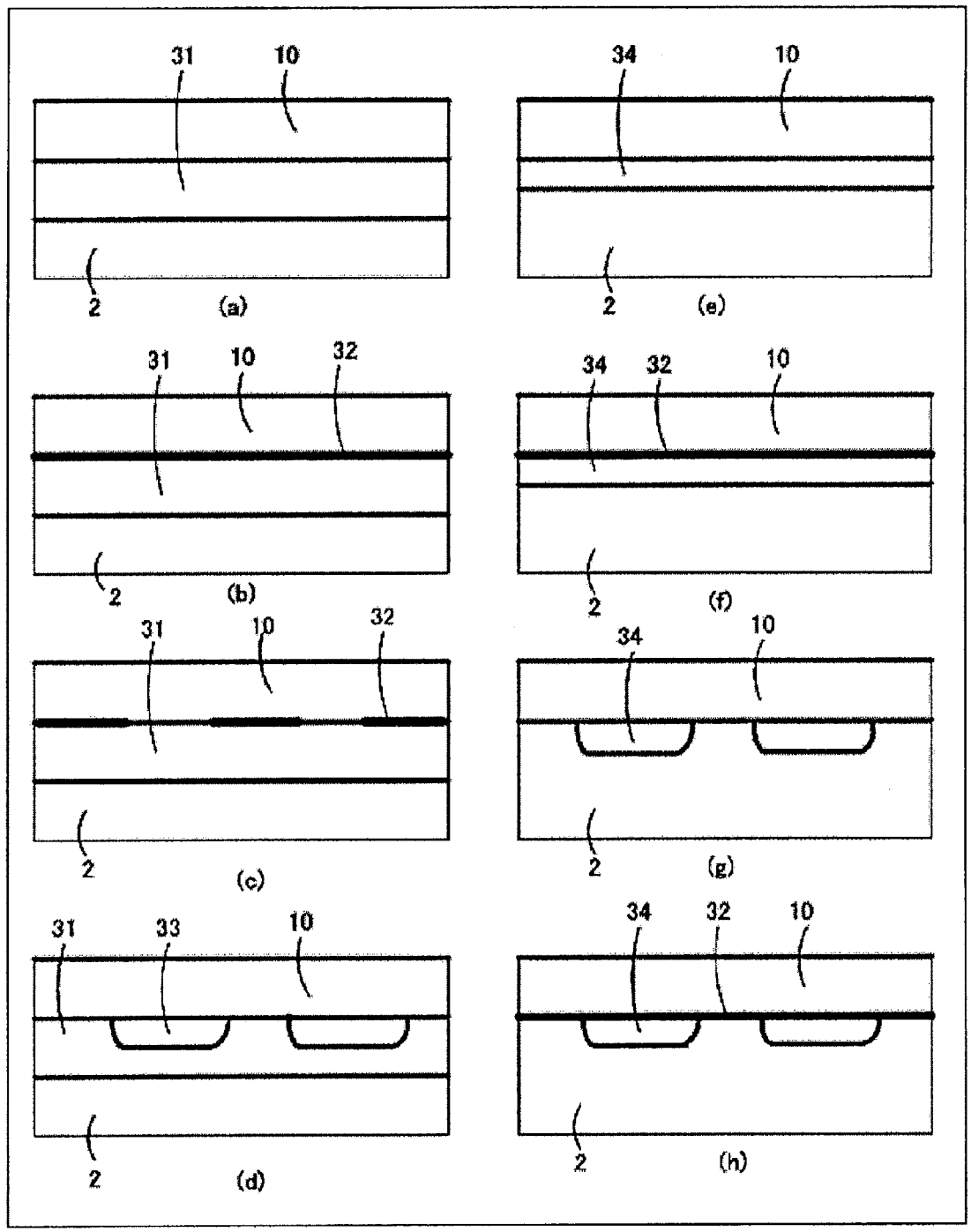
FIG. 7 illustrates substantial part configuration views around the p-anode region 4 of the semiconductor devices 100 to 400 of Examples 1 through 4.

For example, there are configurations as follows regarding the configuration around the p-anode region 4 of the semiconductor devices 100 to 400 in Examples 1 through 4. FIG. 7 illustrates substantial part schematic views of the p-anode region 4 around the semiconductor devices 100 to 400 of Examples 1 through 4. Here, eight types of examples are illustrated. (1) A p⁻ anode region 31 whose impurity density is low is disposed on the n-drift region 2, and on the top thereof the anode electrode 10 is disposed ((a) in the drawing). (2) A high-density p-region 32 whose diffusion depth is shallow is disposed entirely on the p⁻ anode region 31 of (1), and on the top thereof the anode electrode 10 is disposed. This p-region 32 indicated by a bold line corresponds to the p-region 25 illustrated in FIG. 3 ((b) in the drawing). (3) The p-region 32 of (2) is disposed selectively, rather than entirely, on the p⁻ anode region 31 ((c) in the drawing). (4) A high-density p-region 33 is disposed selectively within the p⁻ anode region 31 of (1) ((d) in the drawing). (5) The p⁻ anode region 31 is replaced with a p-anode region 34 whose impurity density is higher and whose diffusion depth is shallower ((e) in the drawing). (6) The high-density p-region 32 whose diffusion depth is shallower is disposed entirely on the p-anode region 34 of (5), and on the top thereof the anode electrode 10 is disposed ((f) in the drawing). (7) The p-anode region 34 of (5) is selectively disposed ((g) in the drawing). (8) The high-density p-region 32 whose diffusion depth is shallower is disposed entirely below the anode electrode 10 of (7) ((h) in the drawing).

As above, the semiconductor device according to embodiments of the present invention is useful in a power semiconductor module.

REFERENCE SIGNS AND NUMERALS ARE AS FOLLOWS 1 n-semiconductor substrate
2 n-drift region
3 n-region
4, 54 p-anode region
5, 28 p-diffusion region
5a bottom part
6, 26, 56 resistance region
6a outer edge part
6b inner edge part
7 resistance edge part region
8 p-guard ring region
9 p-stopper region
10, 60 anode electrode
11 insulating film
11a thermal oxide film
11b PSG film
12 guard ring electrode
13 stop electrode
14, 64 active part 15 n-cathode region
16 cathode electrode
17, 67 edge termination structure
18 buffer region
21, 21a, 71 hole injection
22 accumulation of holes
23, 23a, 73 withdrawal of holes
25 p-region
27 receded point
30 contact edge
31 p⁻ anode region
32, 33 p-region
34 p-anode region
41 equipotential lines
57 extending edge part region
68 extension structure
87 IGBT
88 FWD
100, 200, 300, 400 semiconductor device
W, T width
R, Ra resistance body
Rp, Rp1 resistance value Although a few embodiments have been shown and described, it would be appreciated by those skilled in the art that changes may be made in these embodiments without departing from the principles and spirit of the invention, the scope of which is defined in the claims and their equivalents.

What is claimed is:
1. A semiconductor device comprising:
a semiconductor substrate of a first conductive type;
an active region that is formed on a first primary surface of the semiconductor substrate and allows a primary electric current to flow therethrough;
an edge termination structure surrounding the active region;
a first semiconductor region of a second conductive type, the first semiconductor region being formed in the active region;
a plurality of second semiconductor regions of the second conductive type, the second semiconductor regions constituting the edge termination structure;
a first primary electrode above the first primary surface, electrically connected to the first semiconductor region, having a lower surface in contact with a semiconductor surface on an upper surface of the semiconductor substrate, and having a contact edge at a circumferential edge of the lower surface;
a third semiconductor region of the second conductive type, the third semiconductor region being a resistance region separated from the first primary electrode in a depth direction by an insulating film interposed between the third semiconductor region and the first primary electrode, and the third semiconductor region being between the first semiconductor region and the second semiconductor regions; and
two or more diffusion regions of the second conductive type having different resistances and being respectively disposed in an upper surface of the semiconductor substrate along a direction outward from the first semiconductor region.

2. The semiconductor device as recited in claim 1, wherein the first semiconductor region is connected with either:
the third semiconductor region; or
one of the two or more diffusion regions of the second conductive type.

3. The semiconductor device as recited in claim 2, wherein a diffusion depth of at least one region among the third semiconductor region and the two or more diffusion regions of the second conductive type is deeper than a diffusion depth of all other regions among the third semiconductor region and the two or more diffusion regions of the second conductive type, and deeper than a diffusion depth of the first semiconductor region.

4. The semiconductor device as recited in claim 1, wherein a diffusion depth of at least one region among the third semiconductor region and the two or more diffusion regions of the second conductive type is deeper than a diffusion depth of all other regions among the third semiconductor region and the two or more diffusion regions of the second conductive type, and deeper than a diffusion depth of the first semiconductor region.

5. The semiconductor device as recited in claim 1, wherein the two or more diffusion regions of the second conductive type are, at least in part, located between a portion of the first semiconductor region and the edge termination structure.

6. The semiconductor device as recited in claim 1, wherein
a first diffusion region of the two or more diffusion regions of the second conductive type is a fourth semiconductor region of the second conductive type, the fourth semiconductor region being between and conjoined with the third semiconductor region and the first semiconductor region;
a second diffusion region of the two or more diffusion regions of the second conductive type is a fifth semiconductor region of the second conductive type, the fifth semiconductor region having a higher impurity density and a deeper diffusion depth than those of the third semiconductor region in the second semiconductor region side;
a diffusion depth of the fourth semiconductor region is deeper than a diffusion depth of the third semiconductor region; and
an impurity density in the fourth semiconductor region is lower than an impurity density of the third semiconductor region.

7. The semiconductor device recited in claim 6, wherein a width of the fourth semiconductor region is 5 μm or more and 50 μm or less.

8. The semiconductor device recited in claim 1, wherein
an integral density along a depth direction in the third semiconductor region is greater than an impurity density in the first semiconductor region;
a first diffusion region of the two or more diffusion regions of the second conductive type is a fifth semiconductor region of the second conductive type, the fifth semiconductor region having a deeper diffusion depth and a higher impurity density than that of the third semiconductor region, and connected to an outer circumferential side of the third semiconductor region;
the first semiconductor region extends into a second diffusion region of the two or more diffusion regions of the second conductive type; and
the second diffusion region of the two or more diffusion regions of the second conductive type is connected to the third semiconductor region.

9. The semiconductor device recited in claim 8, wherein a length of the extending portion of the first semiconductor region is 2 μm or more, and less than 50 μm.

10. The semiconductor device recited in claim 1, wherein the first semiconductor region extends into the third semiconductor region;
a first diffusion region of the two or more diffusion regions of the second conductive type is a fifth semiconductor region of the second conductive type, the fifth semiconductor region having a deeper diffusion depth than and a higher impurity density than that of the third semiconductor region, and connected to an outer circumferential side of the third semiconductor region;
a second diffusion region of the two or more diffusion regions of the second conductive type is a sixth semiconductor region of the second conductive type, the sixth semiconductor region being disposed so as to go through the third semiconductor region from an upper surface of the third semiconductor region that is in contact with the insulating film; and
an impurity density in the sixth semiconductor region is higher than an impurity density in the third semiconductor region.

11. The semiconductor device recited in claim 10, wherein the impurity density and a diffusion depth of a portion of the third semiconductor region disposed between the first semiconductor region and the sixth semiconductor region is the same as an impurity density and a diffusion depth of the first semiconductor region, respectively.

12. The semiconductor device recited in claim 10, wherein an impurity density and a diffusion depth of the third semiconductor region is the same as an impurity density and a diffusion depth of the first semiconductor region, respectively.

13. The semiconductor device recited in claim 1, wherein the two or more diffusion regions of the second conductive type are configured such that a reverse recovery current is separated so as to have a portion of the current flowing to an inner circumferential side rather than to the contact edge of the first primary electrode.

* * * * *